(12) United States Patent
Iwamoto et al.

(10) Patent No.: US 11,004,714 B2
(45) Date of Patent: May 11, 2021

(54) LOAD PORT

(71) Applicant: TDK CORPORATION, Tokyo (JP)

(72) Inventors: Tadamasa Iwamoto, Tokyo (JP); Takuya Kudo, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/427,417

(22) Filed: May 31, 2019

(65) Prior Publication Data

US 2020/0266085 A1 Aug. 20, 2020

(30) Foreign Application Priority Data

Feb. 15, 2019 (JP) .............................. JP2019-025680

(51) Int. Cl.
*G01B 11/14* (2006.01)
*H01L 21/68* (2006.01)
*H01L 21/677* (2006.01)

(52) U.S. Cl.
CPC ........ *H01L 21/681* (2013.01); *H01L 21/6773* (2013.01); *H01L 21/67772* (2013.01); *H01L 21/67775* (2013.01)

(58) Field of Classification Search
CPC ............... H01L 21/681; H01L 21/6773; H01L 21/67772; H01L 21/67775; H01L 21/67265
See application file for complete search history.

(56) References Cited

U.S. PATENT DOCUMENTS

| 6,897,463 | B1 | 5/2005 | Cole et al. | |
| 8,837,777 | B2* | 9/2014 | Yasuda | H01L 21/67265 |
| | | | | 382/103 |
| 2006/0131521 | A1* | 6/2006 | Garssen | H01L 21/67265 |
| | | | | 250/559.33 |
| 2010/0243867 | A1* | 9/2010 | Suzuki | H01L 21/67772 |
| | | | | 250/215 |
| 2011/0205354 | A1* | 8/2011 | Enomoto | H01L 21/67265 |
| | | | | 348/96 |
| 2012/0281875 | A1 | 11/2012 | Yasuda et al. | |
| 2017/0178942 | A1 | 6/2017 | Sakata et al. | |

FOREIGN PATENT DOCUMENTS

| JP | H11-354609 A | 12/1999 |
| JP | 2002-164411 A | 6/2002 |
| KR | 10-2012-0103565 A | 9/2012 |
| TW | 201620065 A | 6/2016 |

\* cited by examiner

*Primary Examiner* — Peter B Kim
(74) *Attorney, Agent, or Firm* — Oliff PLC

(57) ABSTRACT

A load port includes a door and a mapping sensor. The door moves upward and downward between a closing position for closing an opening connected into a container with multiple stages for placing a plurality of substrates and an opening position for opening the opening. The mapping sensor is disposed integrally with the door and detects a state of the substrates. The mapping sensor includes a light emitting portion and an imaging portion. The light emitting portion emits an imaging light toward the substrates. The imaging portion captures an image of a reflected light of the imaging light.

20 Claims, 18 Drawing Sheets

LOAD PORT

BACKGROUND OF THE INVENTION

The present invention relates to a load port.

In semiconductor factories, substrates (e.g., silicon wafers) are transported and stored using a container containing the substrates. In the field of semiconductor manufacturing apparatuses, a so-called mini-environment system (local cleaning system) is generally applied, and the inside of the container can thereby have a high cleanliness.

In the mini-environment system, an interface between the container and the semiconductor manufacturing apparatuses is normally referred to as a load port, and this is well known. The load port is generally provided with a mapping sensor, and a housed state of the substrates (whether or not the substrates are overlapped, whether or not the substrates are arranged obliquely, and the like) can be confirmed by the mapping sensor.

As the mapping sensor, for example, a transmission-type light sensor is used. In this case, the mapping sensor is attached to a tip of a mapping device (a mapping arm, a mapping frame, or the like) capable of moving forward and backward in the front-back direction and moving upward and downward in the vertical direction with an optical axis facing the horizontal direction. When the mapping sensor is inserted into an opening of the container by a forward movement of the mapping device and is moved downward, a housed state of the substrates contained in the container can be confirmed by the mapping sensor.

Patent Document 1: JP2002164411 (A)

BRIEF SUMMARY OF INVENTION

To confirm a housed state of the substrate, the above-mentioned conventional mapping sensor needs to dispose the mapping device at an appropriate position and, as shown in Patent Document 1, needs to arrange a pair of light emitting portion and receiver as they sandwich the substrate. In this respect, when the substrate has a circular shape as normal semiconductor wafers have, a space between a circumference of the substrate and an inner wall surface of the container can sufficiently be secured near the opening, and the pair of light emitting portion and receiver can be arranged in the space and sandwich the substrate.

When the substrate has a so-called rectangular shape (e.g., square, oblong), however, the above-mentioned space is not formed between the circumference of the substrate and the inner wall surface of the container, and the pair of light emitting portion and receiver is hard to be arranged and sandwich the substrate using the above-mentioned space. Although the above-mentioned space may be formed by increasing the container in size, increasing the container in size is unfavorable because it causes the increase of the load port and a transportation system in size.

The present invention has been achieved under such circumstances. It is an object of the invention to provide a load port capable of precisely and quickly detecting a state of a substrate without unnecessarily increasing a container or so in size and without being affected by a shape of the substrate.

A load port according to the present invention includes:
a door configured to move upward and downward between a closing position for closing an opening connected into a container with multiple stages for placing a plurality of substrates and an opening position for opening the opening; and
a mapping sensor disposed integrally with the door and configured to detect a state of the substrates,
wherein the mapping sensor includes:
a light emitting portion configured to emit an imaging light toward the substrates; and
an imaging portion configured to capture an image of a reflected light of the imaging light.

In the load port according to the present invention, the opening can be opened by a downward movement of the door from the closing position to the opening position, and the substrates can access the inside of the container via the opening. Via the opening, for example, it is thereby possible to take the substrates contained in the container and to put the substrates into the container.

Since the mapping sensor is disposed integrally with the door, the mapping sensor can move in accordance with an upward and downward movement of the door. Thus, for example, when the door moves downward from the closing position to the opening position, the mapping sensor moves downward while facing the plurality of substrates contained in the container via the opening. Specifically, among the plurality of substrates, the mapping sensor moves downward from the substrate located on the uppermost stage to the substrate located on the lowermost stage.

At this time, the mapping sensor moves downward while capturing the images of the substrates. That is, the light emitting portion emits the imaging light toward the substrate, the imaging portion images the reflected light of the imaging light emitted from the emitting portion, and the image can thereby be captured. This makes it possible to capture the image viewing the substrate from the mapping sensor and including the circumference of one or more substrates. Thus, for example, a housed state of the substrate can be confirmed based on the captured image.

Since the image can be captured in accordance with the downward movement of the door using the mapping sensor disposed integrally with the door, the movement of the door and the detection motion of the mapping sensor do not need to be carried out separately. Thus, the states of the plurality of substrates can be detected at the same time as the downward movement of the door, and it is thereby possible to improve the processing efficiency and to quickly detect the states of the substrates.

Since the state of the substrate can be detected based on the captured image, the state of the substrate can precisely be detected, compared to using, for example, a conventional normal reflective light sensor that carries out a detection using a reflection of a detection light without aiming to capture an image of a substrate (e.g., an image of a circumference of a substrate). That is, the conventional reflective light sensor easily has a low detection accuracy due to a positional shift, a reflection state, a reflection light amount, or the like of the detection light for an object (work). Since the state of the substrate can be detected based on the captured image, however, a precise detection can thereby be carried out without the above-mentioned concerns in using the conventional reflective light sensor.

Moreover, since the state of the substrate can be detected based on the captured image, unlike the conventional transmission-type light sensor, the mapping sensor does not need to enter the container. Thus, there is no need to unnecessarily increase the load port and a transportation system in size. In addition, even if the substrate has a shape other than circle (e.g., rectangle), the state of the substrate can stably be detected without being affected by the shape. It is thereby possible to obtain a load port that can flexibly correspond to various substrates and is easy to use and excellent in convenience.

In the load port according to the present invention, at least one of the light emitting portion and the imaging portion is particularly adjusted so that an optical axis central part of an inner-wall-surface reflected light reflected on an inner wall surface of the container does not directly go to the imaging portion. Thus, the imaging portion can image a reflected light reflected on the circumference of the substrate contained in the container (substrate reflected light) while avoiding the optical axis central part (central part around the optical axis) of the inner-wall-surface reflected light having a strong light intensity. It is thereby possible to capture the image clearly including the circumference of the substrate while preventing the optical axis central part of the inner-wall-surface reflected light from entering the image. Thus, the load port according to the present invention can precisely detect the state of the substrate based on the captured image.

At least one of an optical axis of the imaging light and an imaging axis of the imaging portion may be inclined relative to the inner wall surface located on the other side of the opening or to an opening surface of the opening.

In this case, at least one of the light emitting portion and the imaging portion has an adjusted angle so as to be inclined relative to the inner wall surface of the container located on the other side of the opening. Instead, at least one of the light emitting portion and the imaging portion has an adjusted angle so as to be inclined relative to the opening surface of the opening. At this time, the inclined angle is appropriately adjusted so that the optical axis central part of the inner-wall-surface reflected light goes to a position away from the imaging portion in the return of the inner-wall-surface reflected light to the opening, and the imaging portion can thereby image the substrate reflected light while avoiding the optical axis central part of the inner-wall-surface reflected light having a strong light intensity. This makes it possible to capture the above-mentioned clear image and to carry out a precise detection based on this captured image.

Preferably, at least one of the optical axis of the imaging light and the imaging axis of the imaging portion is inclined toward a lateral of the container.

In this case, at least one of the light emitting portion and the imaging portion has an adjusted angle so as to be inclined laterally relative to the inner wall surface of the container located on the other side of the opening. Instead, at least one of the light emitting portion and the imaging portion has an adjusted angle so as to be inclined laterally relative to the opening surface of the opening. At this time, the inclined angle is appropriately adjusted so that the optical axis central part of the inner-wall-surface reflected light goes laterally while avoiding the imaging portion in the return of the inner-wall-surface reflected light to the opening, and the imaging portion can thereby image the substrate reflected light while avoiding the optical axis central part of the inner-wall-surface reflected light having a strong light intensity.

The optical axis of the imaging light may extend to the inner wall surface located laterally.

In this case, the light emitting portion has an adjusted angle so as to face the inner wall surface located laterally. Thus, after going to this inner wall surface, the light emitted from the light emitting portion is reflected on this inner wall surface and goes to another inner wall surface as the inner-wall-surface reflected light. The inner-wall-surface reflected light going to another inner wall surface is reflected on this inner wall surface and goes to further another inner wall surface or to the opening (imaging portion). Even if this inner-wall-surface reflected light goes to the imaging portion, this light is scattered and absorbed every time it is reflected via the above-mentioned multiple reflections (or via a long light path), and the optical axis central part of the inner-wall-surface reflected light is thereby assumed to have a sufficiently weakened light intensity by the time this inner-wall-surface reflected light reaches the imaging portion. Thus, the load port according to the present invention can prevent the inner-wall-surface reflected light having a strong light intensity from entering the imaging portion and obtain the above-mentioned clear image. Depending on the inclined angle, this effect can also be demonstrated when at least one of the optical axis of the imaging light and the imaging axis of the imaging portion is inclined toward a lateral of the container as described above.

Only the optical axis of the imaging light may be inclined relative to the inner wall surface located on the other side of the opening or to the opening surface of the opening.

In this case, the light emitting portion has an adjusted angle so as to be inclined relative to the inner wall surface or the opening surface of the opening. Meanwhile, the imaging portion is disposed to face the substrates contained in the container via the opening. Thus, the imaging portion can image the substrate reflected light while sufficiently securing a visual field in the container and avoiding the optical axis central part of the inner-wall-surface reflected light having a strong light intensity. It is thereby possible to capture the above-mentioned clear image in a wide visual field and to carry out a precise detection based on the captured image.

At least one of the optical axis of the imaging light and the imaging axis of the imaging portion may be inclined toward a height direction of the container.

In this case, at least one of the light emitting portion and the imaging portion has an adjusted angle so as to be inclined upward or downward relative to the inner wall surface of the container located on the other side of the opening. At this time, the inclined angle is appropriately adjusted so that the optical axis central part of the inner-wall-surface reflected light goes upward or downward while avoiding the imaging portion in the return of the inner-wall-surface reflected light to the opening, and the imaging portion can thereby image the substrate reflected light while avoiding the optical axis central part of the inner-wall-surface reflected light having a strong light intensity.

The light emitting portion and the imaging portion may be laterally spaced from each other along the opening with a predetermined distance.

In this case, at least one of the light emitting portion and the imaging portion has an adjusted position so that the light emitting portion and the imaging portion are spaced from each other. At this time, the distance between the light emitting portion and the imaging portion is appropriately adjusted so that the optical axis central part of the inner-wall-surface reflected light goes to a position laterally away from the imaging portion in the return of the inner-wall-surface reflected light to the opening, and the imaging portion can thereby image the substrate reflected light while avoiding the optical axis central part of the inner-wall-surface reflected light having a strong light intensity.

The light emitting portion may be disposed in a light-emitting-portion installation housing, the imaging portion may be disposed in an imaging-portion installation housing, and the light-emitting-portion installation housing and the imaging-portion installation housing may be formed separately.

In this case, the positions of the light emitting portion and the imaging portion can separately and independently be adjusted via the light-emitting-portion installation housing and the imaging-portion installation housing, and the distance between the light emitting portion and the imaging portion can be adjusted in a wide range. Thus, the positions of the light emitting portion and the imaging portion are flexibly adjusted, and at least one of the light emitting portion and the imaging portion can be disposed at an optimal position.

DETAILED DESCRIPTION OF INVENTION

Hereinafter, the present invention is described based on embodiments shown in the figures.

Figure 1:
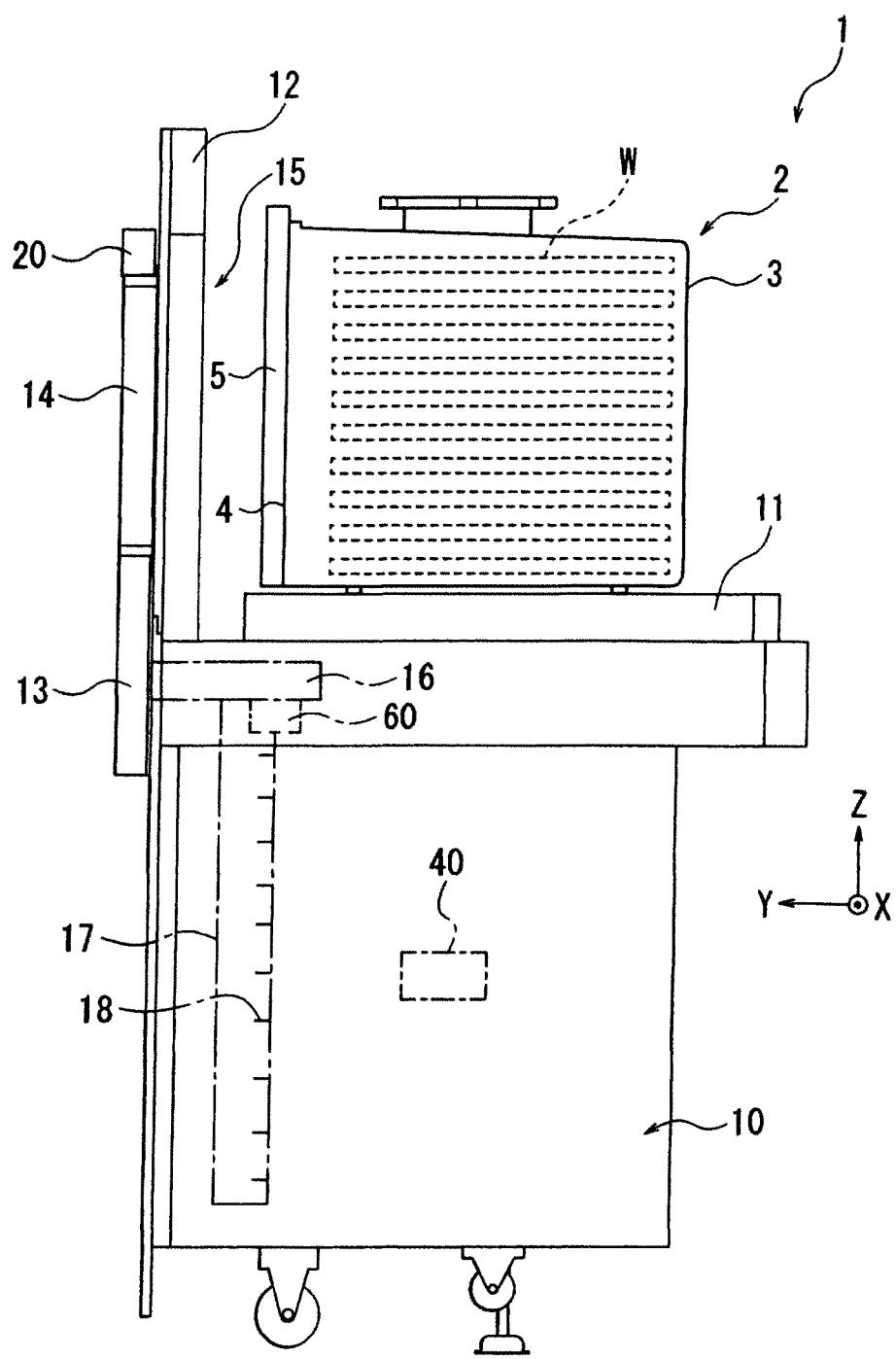
FIG. 1 is a longitudinal cross-sectional view illustrating a load port and a container placed thereon according to First Embodiment of the present invention.

A load port 1 shown in FIG. 1 is a unit that functions as an interface between a container (container for storage) containing a plurality of semiconductor wafers W and a semiconductor manufacturing apparatus (not shown) and constitutes a part of an equipment front end module (EFEM). The EFEM forms a minienvironment where a wafer-transportation robot arm or so is disposed. The robot arm takes the semiconductor wafers W contained in the container 2 therefrom connected with the minienvironment by the load port 1 and transports the semiconductor wafers W to semiconductor processing apparatuses. Incidentally, for example, the container 2 is a front-opening unified pod (FOUP).

The load port 1 includes a control box 10, a movable table 11, a frame 12, a support frame 13, a door 14, a drive portion 16, a rod 17, a sensor dog 18, a mapping sensor 20, and the like. The control box 10 contains the drive portion 16 for driving the door 14, a controller 40 for controlling various motions by the mapping sensor 20, and the like.

The container 2 containing substrates (the semiconductor wafers W in the present embodiment) and storing and transporting the semiconductor wafers W can detachably be placed on the movable table 11. The movable table 11 is formed from a table that moves in the Y-axis direction while the container 2 is placed on the table and can connect a container opening 4 of the container 2 with an opening 15 of the frame 12. In the figures, the Y-axis is a movement direction (front-back direction) of the movable table 11. In the front-back direction, the positive side of the Y-axis direction is the front, and the negative side of the Y-axis direction is the back. The X-axis is a crosswise direction, and the Z-axis direction is a vertical direction.

Here, the container 2 is briefly explained.

Figure 4:
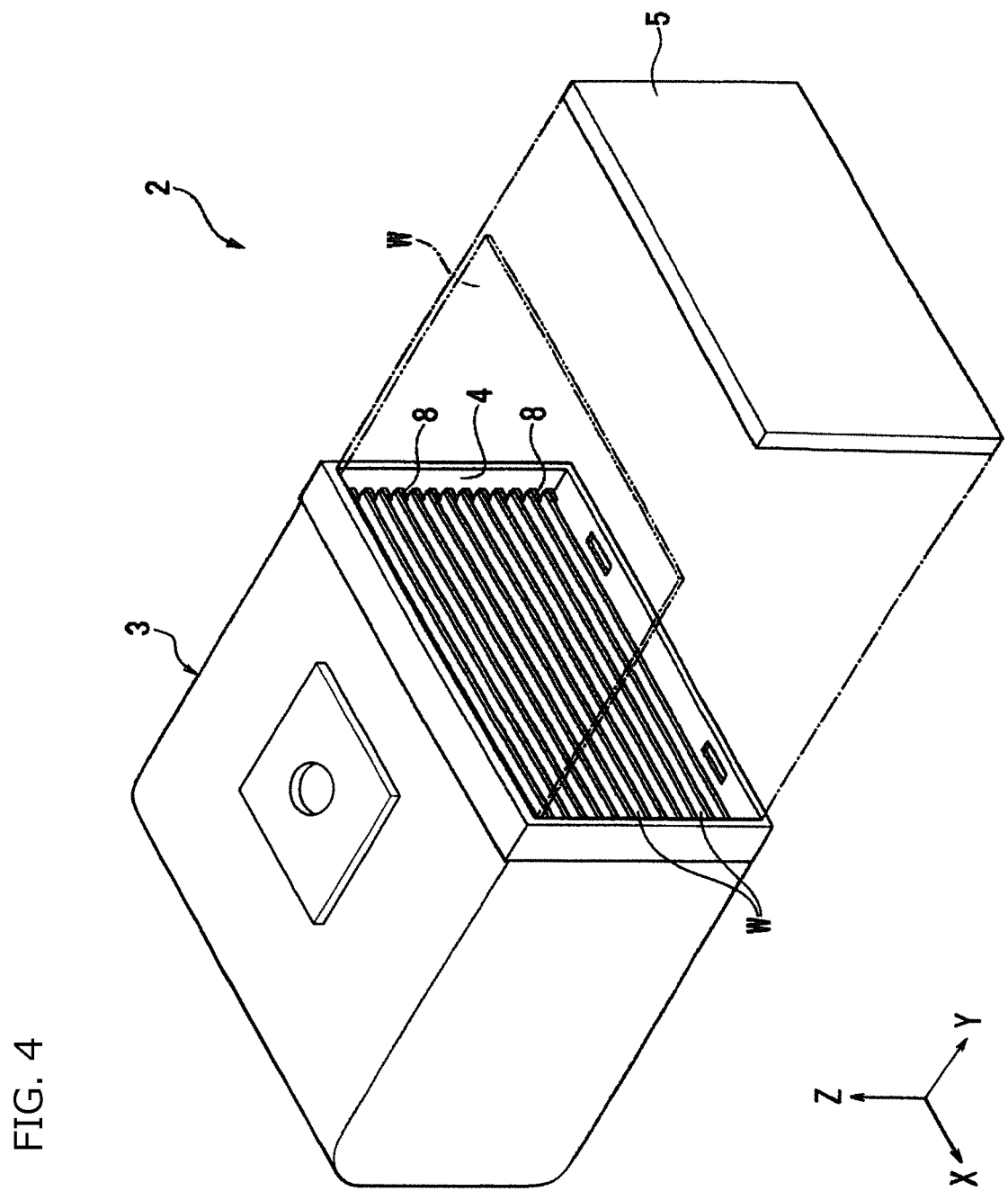
FIG. 4 is a perspective view of the container shown in FIG. 1.

As shown in FIG. 4, a container body 3 contains a housing shelf 8 extending in the front-back direction, facing in the crosswise direction, and having a plurality of stages arranged at predetermined intervals in the vertical direction. The semiconductor wafers W are housed using the housing shelf 8. Thus, the semiconductor wafers W are housed in the container 2 while being arranged on the plurality of stages in the vertical direction.

In the present embodiment, the semiconductor wafers W are rectangular, but may have any other shapes, such as circular shape.

As shown in FIG. 1, the frame 12 extends upward from the movable table 11, and the movable table 11 and the container 2 placed thereon move to or from the frame 12 in the front-back direction. The frame 12 includes the opening 15 facing the container opening 4 of the container 2. The opening 15 is opened and closed by the door 14. The frame 12 can separate the processing chambers of the semiconductor manufacturing apparatuses and the outside space of the semiconductor manufacturing apparatuses.

The door 14 can open and close the container opening 4 by opening and closing the opening 15 and being engaged with a lid 5 disposed detachably at the container opening 4 of the container 2. In the load port 1, the movable table 11 moves the container 2 forward so as to bring the container 2 into contact with the frame 12, the door 14 gets engaged with the lid 5 of the container 2 so as to draw the container 2 into the minienvironment, and the container 2 and the minienvironment can thereby get connected via the container opening 4 of the container 2.

The lower edge of the door 14 is integrally connected with the support frame 13. The support frame 13 is connected with the drive portion 16 disposed in the control box 10. The drive portion 16 moves downward along the rod 17 extending in the vertical direction. Thus, the door 14 can move downward by the support frame 13.

Figure 3:
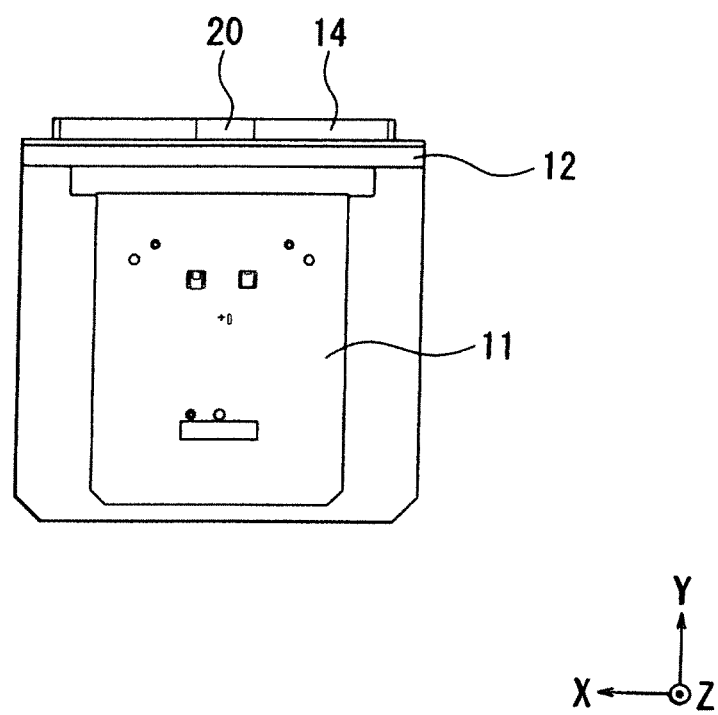
FIG. 3 is a plane view of the load port shown in FIG. 1.

The mapping sensor 20 detects the state of the semiconductor wafers W. As shown in FIG. 1 and FIG. 3, the mapping sensor 20 is integrally fixed to the upper edge of the door 14. Specifically, the mapping sensor 20 is fixed to a central part around the upper end of the door 14 in the crosswise direction by a fixing means (not shown) or so.

The mapping sensor 20 is disposed above the semiconductor wafer W located on the uppermost stage among the plurality of semiconductor wafers W contained in the container 2. Incidentally, the mapping sensor 20 may movably be fixed to the upper edge of the door 14 in the crosswise direction. In this case, the position of the mapping sensor 20 can be adjusted as necessary.

Figure 5A:
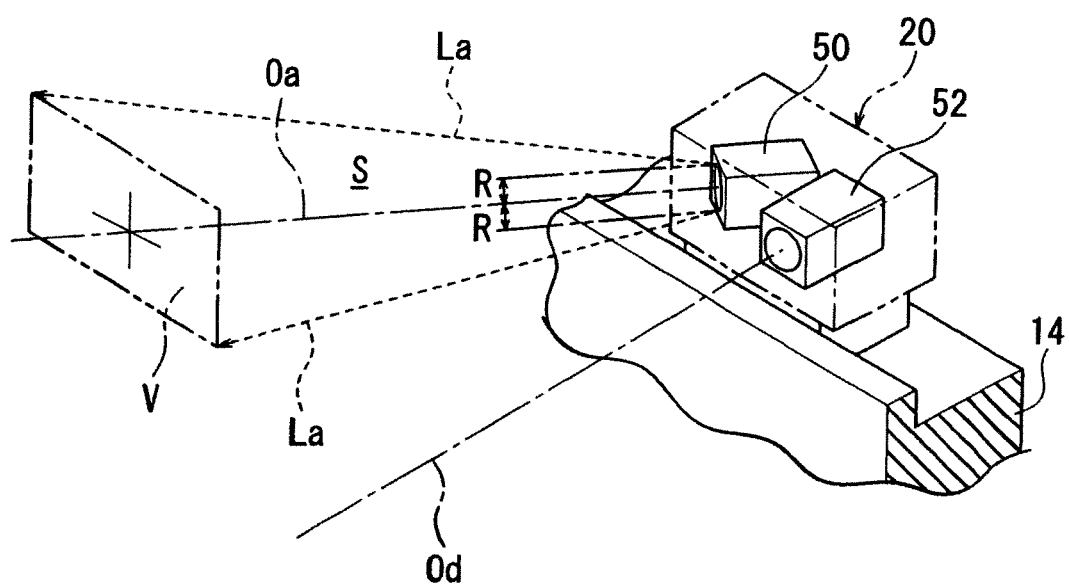
FIG. 5A is an enlarged perspective view around a mapping sensor shown in FIG. 1.
Figure 6A:
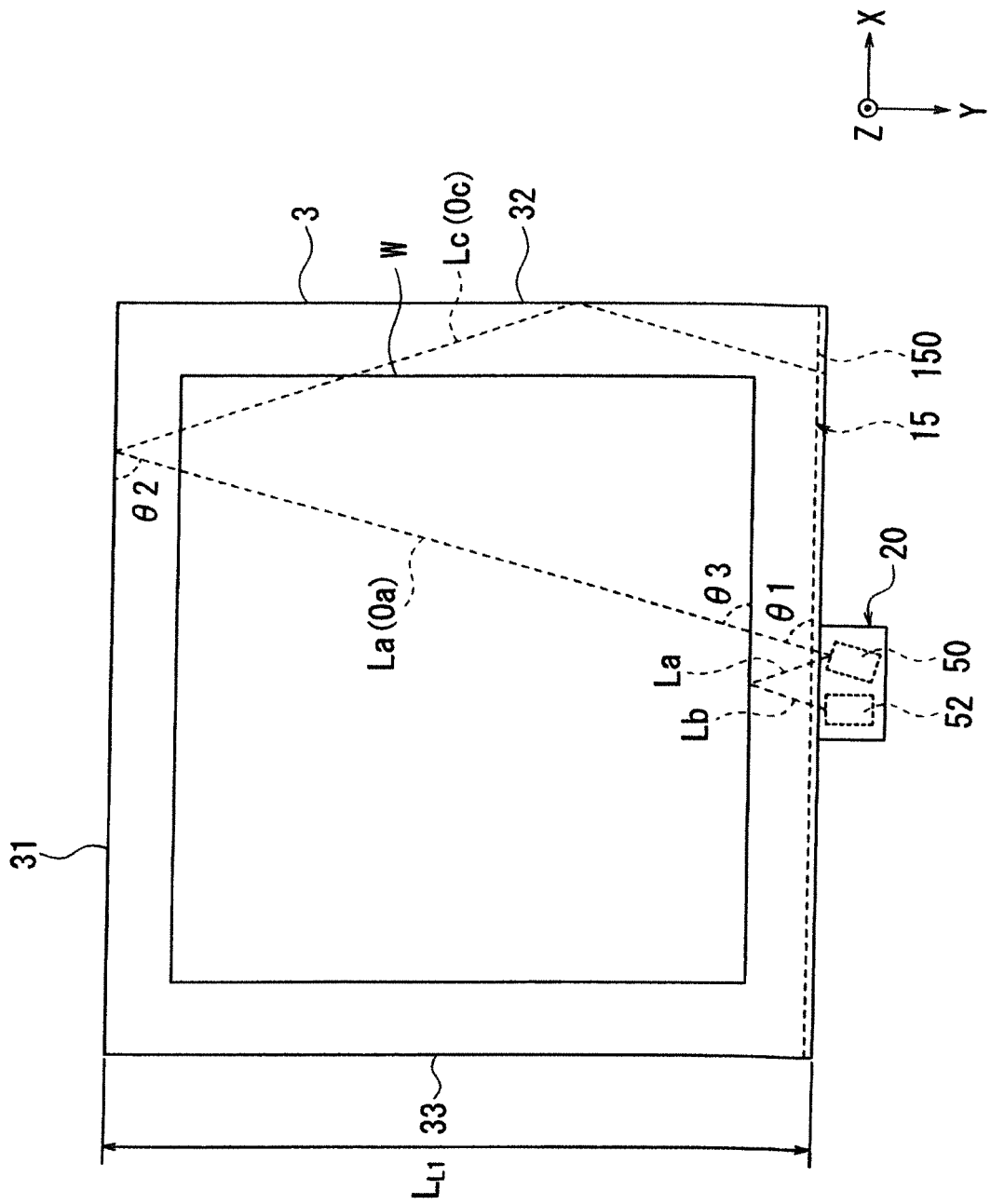
FIG. 6A is a schematic view for explaining an optical path of a light emitted from a light emitting portion constituting the mapping sensor shown in FIG. 5A.

As shown in FIG. 5A, the mapping sensor 20 includes a light emitting portion 50 and an imaging portion 52. The light emitting portion 50 emits an imaging light La forward toward the semiconductor wafers W. The imaging portion 52 obtains a captured image 51 (see FIG. 10) by capturing a reflected light of the light La emitted from the light emitting portion 50 (within a lighted area S by the light emitting portion 50). As shown in FIG. 6A, the reflected light of the light La includes, for example, a substrate reflected light Lb (a reflected light reflected on the outer circumferential edge of the semiconductor wafer W) and an inner-wall-surface reflected light Lc (a reflected light reflected on the inner wall surface of the container body 3). Incidentally, as shown in FIG. 5A, the imaging portion 52 obtains the image 51 by capturing a virtual image surface V crossing the optical axis Oa of the light La. Thus, the mapping sensor 20 is an image capture sensor (or a surface photoelectric sensor) that captures a bidimensional image 51.

Figure 9:
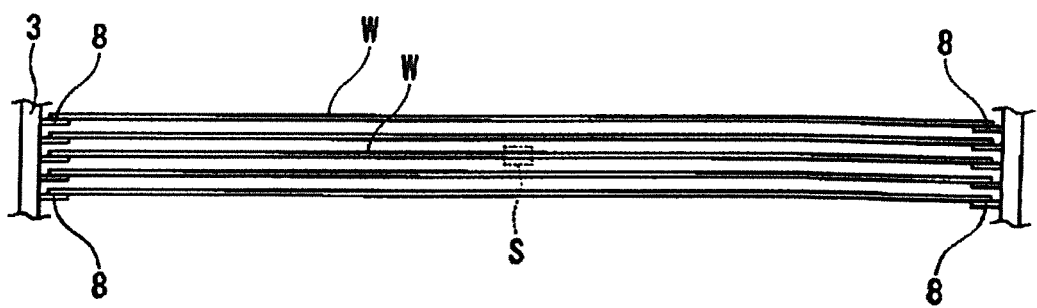
FIG. 9 is a schematic view for explaining an irradiation area irradiated by an irradiation portion of the mapping sensor shown in FIG. 5A to FIG. 5D.
Figure 10:
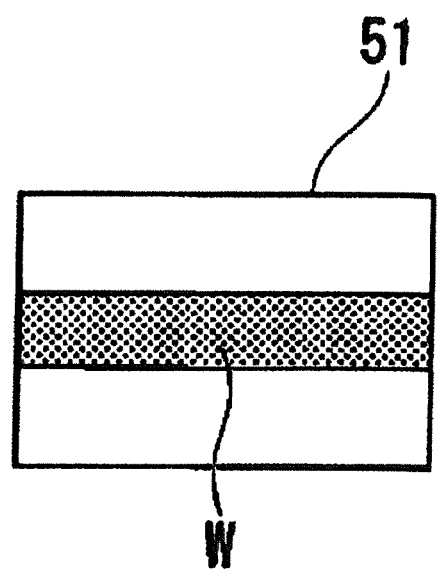
FIG. 10 is a view illustrating an image captured by the mapping sensor shown in FIG. 5A to FIG. 5D.

The light emitting portion 50 is, for example, an LED and emits a light La adjusted to a predetermined wavelength band. Incidentally, for example, the emission timing of the light emitting portion 50 is controlled by the controller 40. As shown in FIG. 9 and FIG. 10, the light emitting portion 50 emits the light La so that a piece of semiconductor wafer W is contained within the lighted area S by adjusting the light emitting angle, the light emitting intensity, and the like.

As shown in FIG. 5A, the light La emitted from the light emitting portion 50 is spread around the optical axis Oa in the centrifugal direction. Hereinafter, the vicinity of the optical axis Oa with a strong light intensity is referred to as a "central part around the optical axis Oa". The "central part around the optical axis Oa" is defined as, for example, an area surrounded by a circle whose radius is 3 R or less with the center (optical axis Oa), where R is a spread width of the light La (on the end surface of the light emitting portion 50) with the center (optical axis Oa) in the centrifugal direction immediately after the emission of the light La from the light emitting portion 50.

As shown in FIG. 6A, the light emitting portion 50 has an adjusted angle so as to be inclined laterally relative to a first inner wall surface 31 of the container body 3 located on the other side of the opening 15. Also, the light emitting portion 50 has an adjusted angle so as to be inclined relative to an opening surface 150 of the opening 15.

Thus, the optical axis Oa of the light La emitted from the light emitting portion 50 is inclined toward the lateral of the container body 3 (laterally in the crosswise direction) relative to the first inner wall surface 31 (an inner wall surface of the container body 3 located on the other side of the opening 15) or the opening surface 150 of the opening 15. Thus, the optical axis Oa of the light La emitted from the light emitting portion 50 goes obliquely (obliquely and laterally) to the first inner wall surface 31. The optical axis Oa of the light La is inclined toward the lateral of the semiconductor wafer W and goes to the circumference of the rectangular semiconductor wafer W.

In the illustrated example, the light emitting portion 50 has an adjusted angle so as to be inclined toward the opposite side of the imaging portion 52. Thus, the optical axis Oa of the light La does not extend to a third inner wall surface 33, but to a second inner wall surface 32 located on the other side in the crosswise direction. In the present embodiment, the optical axis Oa of the light La crosses a part of the first inner wall surface 31 closer to the second inner wall surface 32 in the crosswise direction.

As shown in FIG. 5A, the imaging portion 52 does not have an adjusted angle as described above, and only the light emitting portion 50 has an adjusted angle as described above. Thus, the optical axis Oa of the light La and an imaging axis Od of the imaging portion 52 are not substantially parallel to each other.

As shown in FIG. 6A, $\Theta 1 < 90$ degrees is satisfied (preferably $\Theta 1 < 88$ degrees, more preferably 80 degrees $< \Theta 1 < 85$ degrees), where $\Theta 1$ is an angle between the optical axis Oa of the light La and the opening surface 150 of the opening 15 (an inclined angle of the optical axis Oa in the crosswise direction). When the first inner wall surface 31 of the container body 3, the opening surface 150 of the opening 15, and the circumference of the semiconductor wafer W are substantially parallel to each other, the above-mentioned ranges also apply to $\Theta 2$ and $\Theta 3$, where $\Theta 2$ is an angle between the optical axis Oa of the light La and the first inner wall surface 31 of the container body 3, and $\Theta 3$ is an angle between the optical axis Oa of the light La and the circumference of the semiconductor wafer W.

In the present embodiment, however, the angles $\Theta 1$ to $\Theta 3$ are configured in a range where the optical axis Oa of the light La does not cross the second inner wall surface 32. That is, the lower limits of the angles $\Theta 1$ to $\Theta 3$ are values of the angles $\Theta 1$ to $\Theta 3$ when the optical axis Oa goes to the corner of the container body 3 crossed by the first inner wall surface 31 and the second inner wall surface 32.

Incidentally, an angle (an inclined angle of the optical axis Oa in the front-back direction) between the optical axis Oa of the light La and the second inner wall surface 32 or the third inner wall surface 33 (or the imaging axis Od of the imaging portion 52 shown in FIG. 5A) is (90-$\Theta 1$) degrees.

When the light emitting portion 50 has an adjusted angle as described above, the inner-wall-surface reflected light Lc obliquely goes from the first inner wall surface 31 to the second inner wall surface 32 (an inner wall surface located on the lateral of the container body 3), is reflected on the second inner wall surface 32, and obliquely goes from the second inner wall surface 32 to the opening 15.

Since the light La obliquely goes to the first inner wall surface 31, and since the inner-wall-surface reflected light Lc obliquely goes to the second inner wall surface 32 and the opening 15, each of the light La and the inner-wall-surface reflected light Lc has an optical path length that is larger than a length $L_{L1}$ of the container body 3 in the front-back direction. For example, the optical path length of the light La is substantially equal to $L_{L1}/\sin \Theta 1$. Thus, the sum of the optical path lengths of the light La and the inner-wall-surface reflected light Lc is larger than the double ($2 L_{L1}$) of the length $L_{L1}$.

The central part around the optical axis Oc of the inner-wall-surface reflected light Lc going to the opening 15 passes through a position laterally (right side) away from the imaging portion 52 in the crosswise direction so as to avoid the imaging portion 52 on the opening surface 150. That is, the central part around the optical axis Oc of the inner-wall-surface reflected light Lc passes between the imaging portion 52 and the edge of the opening surface 150 in the crosswise direction crossing the second inner wall surface 32 and does not go to (enter) the imaging portion 52 with a light amount similar to that when the above-mentioned angle adjustment is not carried out. Accordingly, the light emitting portion 50 is adjusted so that the central part around the optical axis Oc of the inner-wall-surface reflected light Lc does not go to the imaging portion 52.

In the illustrated example, the imaging portion 52 and the passage position of the central part around the optical axis Oc of the inner-wall-surface reflected light Lc are sufficiently away from each other, and the entire central part around the optical axis Oc is adjusted so as not to go to the imaging portion 52. If most of the central part around the optical axis Oc do not go to the imaging portion 52, however, the central part around the optical axis Oc may partially enter the imaging portion 52.

The central part around the optical axis Oc of the inner-wall-surface reflected light Lc does not directly go to the opening 15, but is reflected once on the second inner wall surface 32 and thereafter goes to the opening 15. That is, the light emitting portion 50 is adjusted so that the central part around the optical axis Oc of the inner-wall-surface reflected light Lc does not directly go to the opening 15 (in addition, to the imaging portion 52).

Depending upon the values of the angles θ1 to θ3, it is assumed that the central part around the optical axis Oc of the inner-wall-surface reflected light Lc directly goes to the opening 15 without being reflected on the second inner wall surface 32. However, if for example, the central part around the optical axis Oc of the inner-wall-surface reflected light Lc directly goes to the edge of the opening surface 150 in the crosswise direction crossing the second inner wall surface 32 without being reflected on the second inner wall surface 32, it is acceptable since the central part around the optical axis Oc of the inner-wall-surface reflected light Lc does not directly go to the imagining portion 52.

As shown in FIG. 5A, the imaging portion 52 is, for example, a solid-state imaging element (e.g., CMOS) and captures the image 51 corresponding to, for example, a light emission intensity and outputs the captured image 51 to the controller 40. The substrate reflected light Lb, the inner-wall-surface reflected light Lc, and the like enter the imaging portion 52. Incidentally, the capture timing of the imaging portion 52 is controlled by, for example, the controller 40.

Since the light emitting portion 50 emits the light La so that a piece of semiconductor wafer W is contained within the lighted area S as shown in FIG. 9, the imaging portion 52 can capture the image 51 including only the piece of semiconductor wafer W as shown in, for example, FIG. 10.

Figure 2:
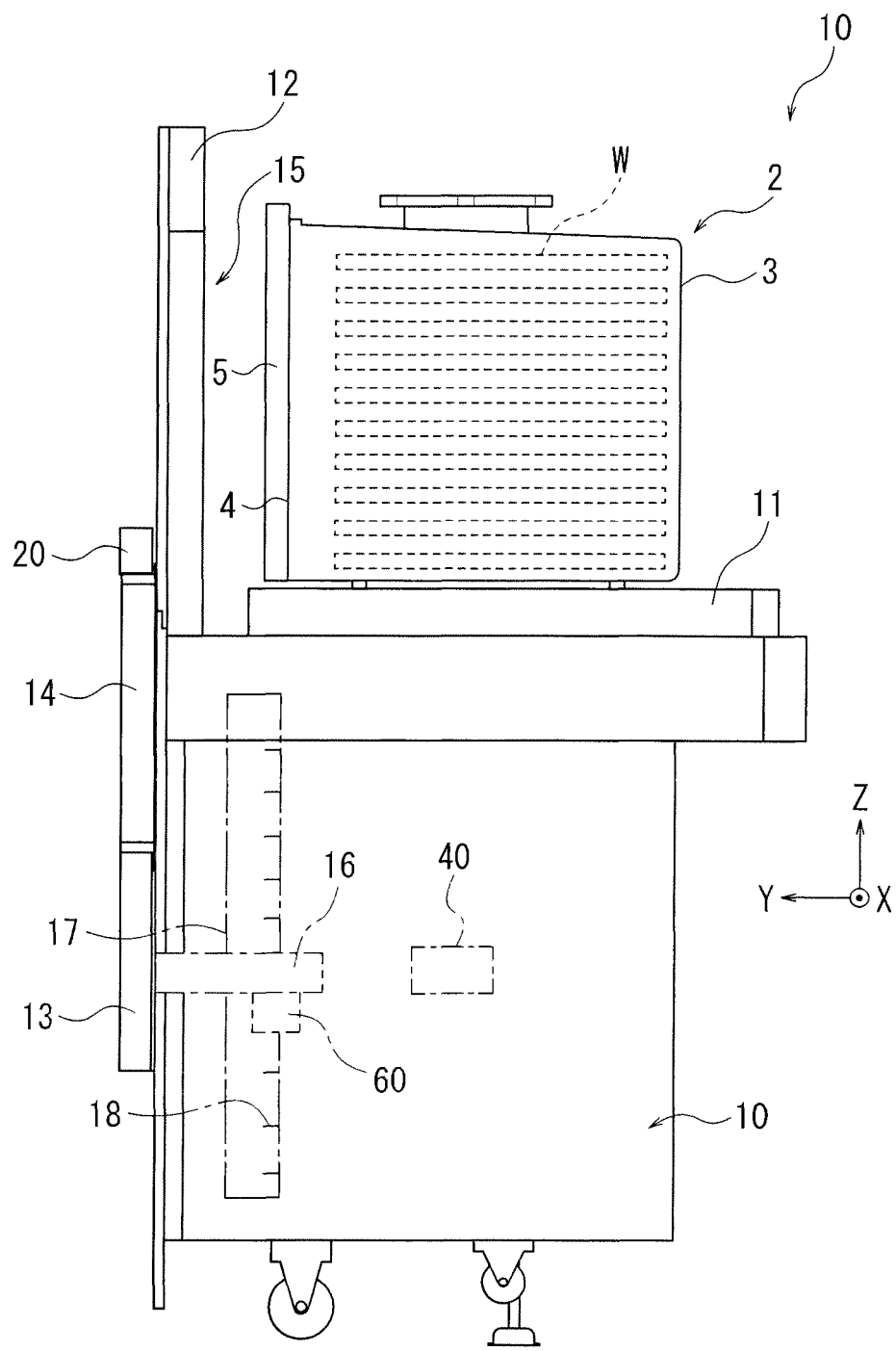
FIG. 2 is a longitudinal cross-sectional view of the load port and the container placed thereon shown in FIG. 1 illustrating a door of the load port moved downward.

The mapping sensor 20 can move vertically in accordance with a vertical movement of the door 14. Specifically, among the plurality of semiconductor wafers W (see FIG. 1 and FIG. 2), the mapping sensor 20 moves downward from the semiconductor wafer W located on the uppermost stage to the semiconductor wafer W located on the lowermost stage.

Then, when the door 14 moves downward, the mapping sensor 20 captures the image 51 at a position behind the semiconductor wafers W with a predetermined distance. The focal distance, the field angle, and the like of the imaging portion 52 are appropriately adjusted so that the image 51 can appropriately be captured with the above-mentioned distance.

The controller 40 records the image 51 captured by the mapping sensor 20 at a data record section (not shown). Incidentally, the controller 40 may output the captured image 51 to a display monitor (not shown). In addition, a position detection signal indicating a relative position of the mapping sensor 20 moving downward to the semiconductor wafers W is inputted from a position detection sensor 60 (see FIG. 1) to the controller 40.

Here, the position detection sensor 60 is briefly explained.

As shown in FIG. 1, the sensor dog 18 being long in the Z-axis direction is attached to the rod 17. The position detection sensor 60 is attached to the drive portion 16 and moves upward and downward along the sensor dog 18 in accordance with an upward and downward movement of the drive portion 16.

The position detection sensor 60 is, for example, transmission-type optical sensors arranged to sandwich the sensor dog 18 and face each other in the crosswise direction and having a light irradiation portion and a receiver (not shown). The position detection sensor 60 moves upward and downward along the sensor dog 18 while the receiver is receiving a detection light from the light irradiation portion and outputs a position detection signal corresponding to a received result of the receiver to the controller 40.

For example, the sensor dog 18 is a slit cam. The slit cam has a plurality of slits vertically arranged with predetermined intervals. Each position of the slits is detected by the position detection sensor 60 at the same time as capture of the image 51 by the mapping sensor 20. The number of slits and the pitch correspond to those of multiple stages of the shelf 8 contained in the container 2. In this structure, the controller 40 can confirm a relative position of the mapping sensor 20 to the semiconductor wafers W based on the position detection signal detected by the position detection sensor 60.

Thus, the controller 40 can confirm which stage of the housing shelf 8 of the container 2 the image 5 captured by the mapping sensor 20 is housed. Then, the controller 40 records the image 51 captured by the mapping sensor 20 at the data record section in correspondence with a housed position of the semiconductor wafer W in the container 2.

The mapping sensor 20 moves downward while capturing the images 51 of the semiconductor wafers W by receiving a direction from the controller 40. That is, as shown in FIG. 5A, the light emitting portion 50 emits an imaging light La toward the semiconductor wafer W, the imaging portion 52 images a reflected light (a substrate reflected light Lb or an inner-wall-surface reflected light Lc) of the light La emitted from the light emitting portion 50, and the captured image 51 is thereby obtained. In addition to the reflected light of the light La, the light forming the captured image 51 may include a reflected light from other light sources.

At this time, the imaging portion 52 captures the image 51 by imaging the image surface V crossing the optical axis O of the light La, and it is thereby possible to capture the image 51 viewed from the mapping sensor 20 and including the circumference of the semiconductor wafer W as shown in FIG. 10.

Figure 8:
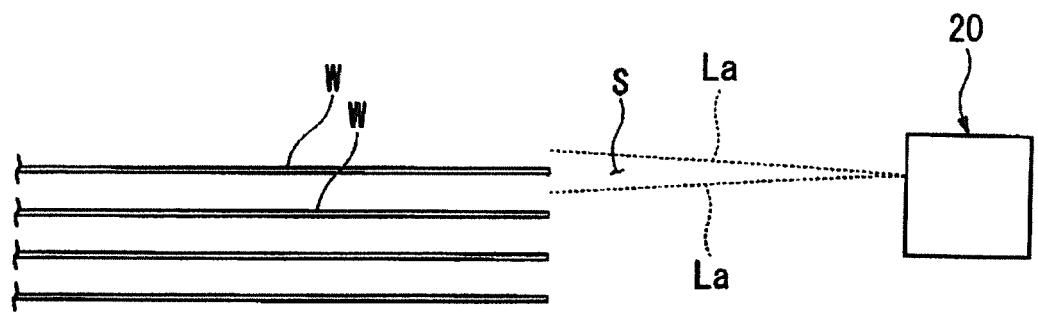
FIG. 8 is a schematic view for explaining a state where an image of a semiconductor wafer is being captured using the mapping sensor shown in FIG. 5A to FIG. 5D.

In particular, as shown in FIG. 8 and FIG. 9, the light emitting portion 50 emits the light La so that only a piece of semiconductor wafer W is contained within the lighted area S. Thus, the imaging portion 52 can capture the image 51 including only the circumference of the piece of semiconductor wafer W. Then, the mapping sensor 20 outputs the captured image 51 to the controller 40.

Then, the controller 40 records the image 51 captured by the mapping sensor 20 at the data record section (not shown) in correspondence with a housed position of the semiconductor wafer W in the container 2 and displays the captured image 51 on a display monitor as necessary.

Via the data record section or the display monitor, for example, an operator can confirm the captured image 51 and a housed state of the semiconductor wafer W based on the captured image 51. For example, the operator can confirm whether or not the semiconductor wafers W are overlapped on the same stage of the housing shelf 8, whether or not the semiconductor wafers W are housed obliquely on different stages of the housing shelf 8, whether or not the semiconductor wafers W are housed in the housing shelf 8, and the like.

In addition, since the image 51 captured by the mapping sensor 20 corresponds to a housed position of the semiconductor wafer W in the container 2, even if there is a badly housed semiconductor wafer W, the housed position of the badly housed semiconductor wafer W can accurately be confirmed (i.e., which stage of the housing shelf 8 the badly housed semiconductor wafer W is on). This can control, for example, a handling robot to avoid accessing the badly housed semiconductor wafer W.

In particular, since the image 51 can be captured in accordance with a downward movement of the door 14 using the mapping sensor 20 integrally formed with the door 14, the movement of the door 14 and the detection motion of the mapping sensor 20 do not need to be carried out separately. Thus, the states of the plurality of semiconductor wafers W can be detected at the same time as the downward movement of the door 14, and it is thereby possible to improve the processing efficiency and to quickly detect the states of the semiconductor wafers W. Thus, for example, a mapping operation for detecting the existence of the semiconductor wafer W can efficiently be carried out.

Since the state of the semiconductor wafer W can be detected based on the captured image 51, the state of the semiconductor wafer W can precisely be detected, compared to using, for example, a conventional normal reflective light sensor that carries out a detection using a reflection of a detection light without aiming to capture an image of a substrate (e.g., an image of a circumference of a substrate). That is, the conventional reflective light sensor easily has a low detection accuracy due to a positional shift, a reflection state, a reflection light amount, or the like of the detection light for an object (work).

In the load port 1 according to the present embodiment, however, the state of the semiconductor wafer W can be detected based on the captured image 51, and a precise detection can thereby be carried out without the above-mentioned concerns in using the conventional reflective light sensor. Thus, for example, a mapping operation for detecting the existence of the semiconductor wafer W can precisely be carried out.

Moreover, since the state of the semiconductor wafer W can be detected based on the captured image 51, unlike the conventional transmission-type light sensor, the mapping sensor 20 does not need to enter the container 2. Thus, the structure for putting the mapping sensor 20 into the container 2 is unnecessary, and this easily simplifies the entire structure.

Moreover, the rectangular semiconductor wafer W can even be dealt with, and the state of the semiconductor wafer W can stably be detected without being affected by the shape of the semiconductor wafer W. It is thereby possible to obtain a load port 1 that can flexibly correspond to various semiconductor wafers W and is easy to use and excellent in convenience.

As described above, the load port 1 according to the present embodiment can be downsized and precisely and quickly detect the states of the semiconductor wafers W without being affected by the shapes of the semiconductor wafers W. It is thereby possible to quickly determine a housed state of each of the semiconductor wafers W contained in the housing shelf 8 of the container 2 (whether or not the semiconductor wafers W are overlapped, whether or not the semiconductor wafers W are arranged obliquely, whether or not the semiconductor wafers W are present, and the like). In particular, a mapping operation for detecting the existence of the semiconductor wafers W can be carried out precisely and quickly.

In the present embodiment, since the image 51 is captured to include only a piece of semiconductor wafer W, the states of the semiconductor wafers W can be detected one by one, and an accurate detection can be carried out.

In the load port 1 according to the present embodiment, the light emitting portion 50 is adjusted so that the central part around the optical axis Oc of the inner-wall-surface reflected light Lc does not directly go to the imaging portion 52. Thus, the imaging portion 52 can image the substrate reflected light Lb reflected on the circumference of the semiconductor wafer W contained in the container body 3 while avoiding the central part around the optical axis Oc of the inner-wall-surface reflected light Lc having a strong light intensity. It is thereby possible to capture the image 51 clearly including the circumference of the semiconductor wafer W while preventing the central part around the optical axis Oc of the inner-wall-surface reflected light Lc from entering the captured image 51. Thus, the load port 1 according to the present embodiment can precisely detect the state of the semiconductor wafer W based on the captured image 51.

In the present embodiment, the imaging portion 52 is disposed to face the semiconductor wafers W contained in the container body 3 via the opening surface 150 of the opening 15 while the light emitting portion 50 has an adjusted angle so as to be inclined relative to the first inner wall surface 31. Thus, the imaging portion 52 can image the inner-wall-surface reflected light Lc while sufficiently securing a visual field in the container body 3 and avoiding the central part around the optical axis Oc of the substrate reflected light Lb having a strong light intensity. It is thereby possible to capture the above-mentioned clear image 51 in a wide visual field and to carry out a precise detection based on the captured image 51.

Figure 6B:
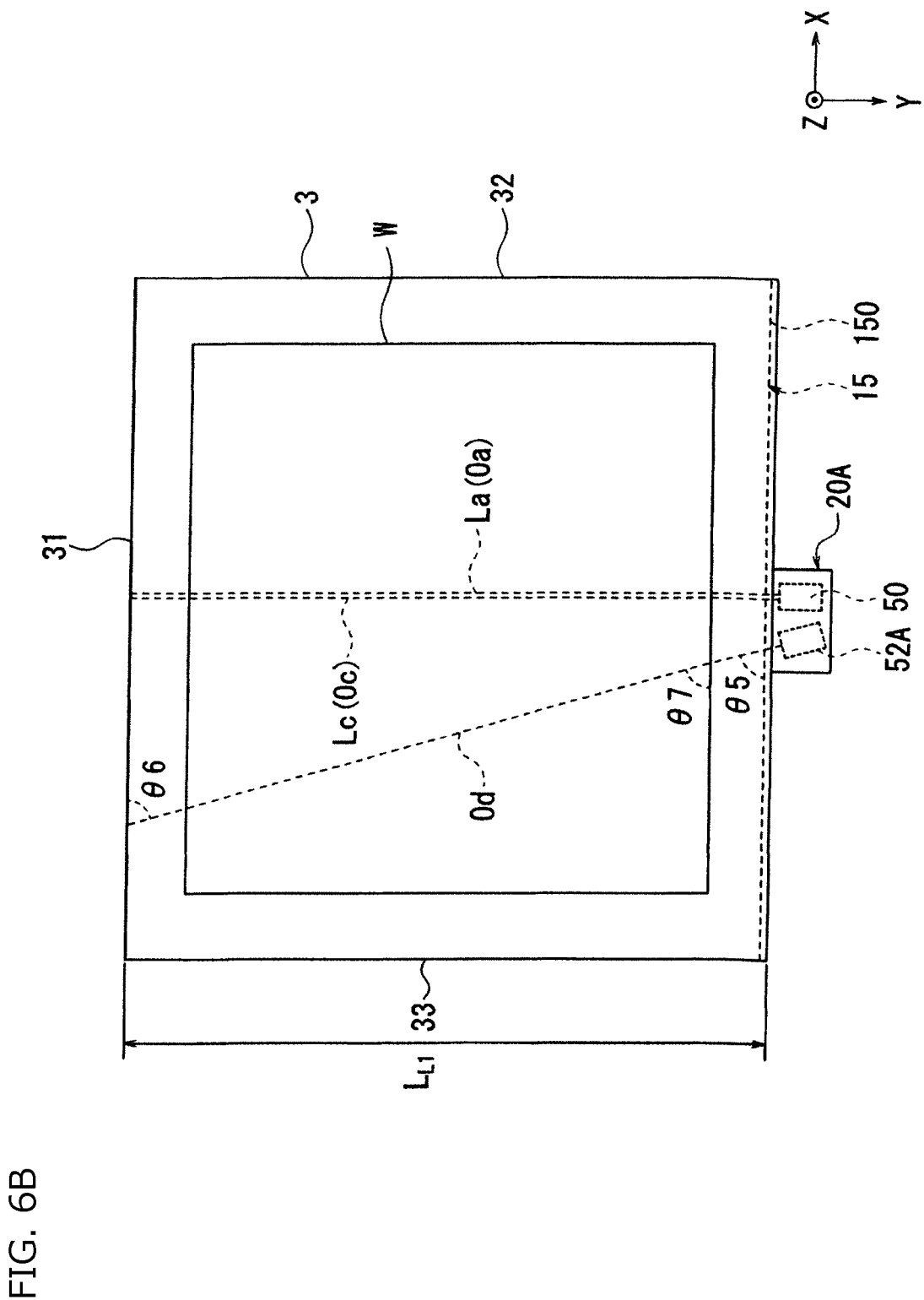
FIG. 6B is a schematic view for explaining an optical path of a light emitted from a light emitting portion constituting the mapping sensor shown in FIG. 5B.
Figure 6C:
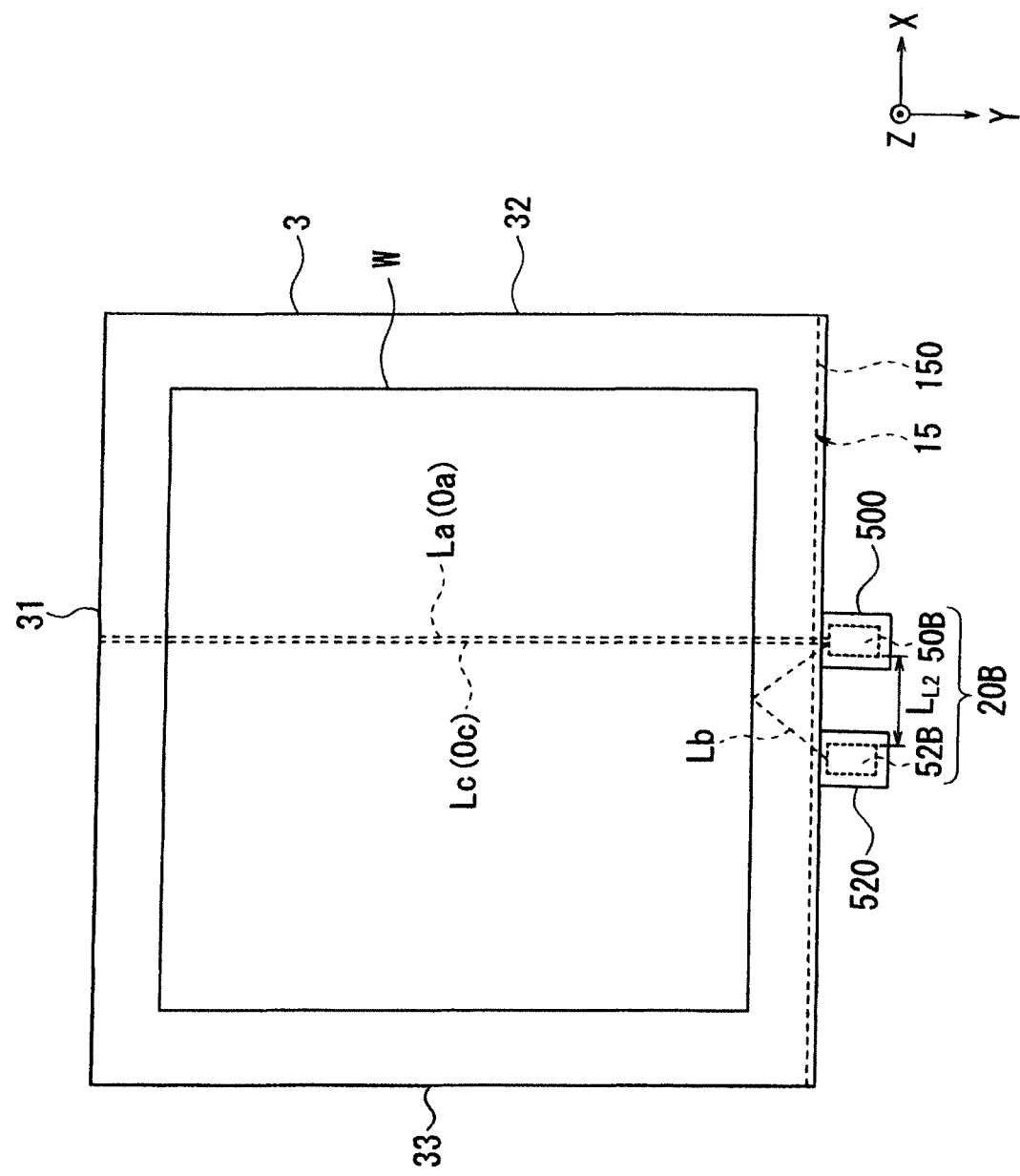
FIG. 6C is a schematic view for explaining an optical path of a light emitted from a light emitting portion constituting the mapping sensor shown in FIG. 5C.
Figure 6D:
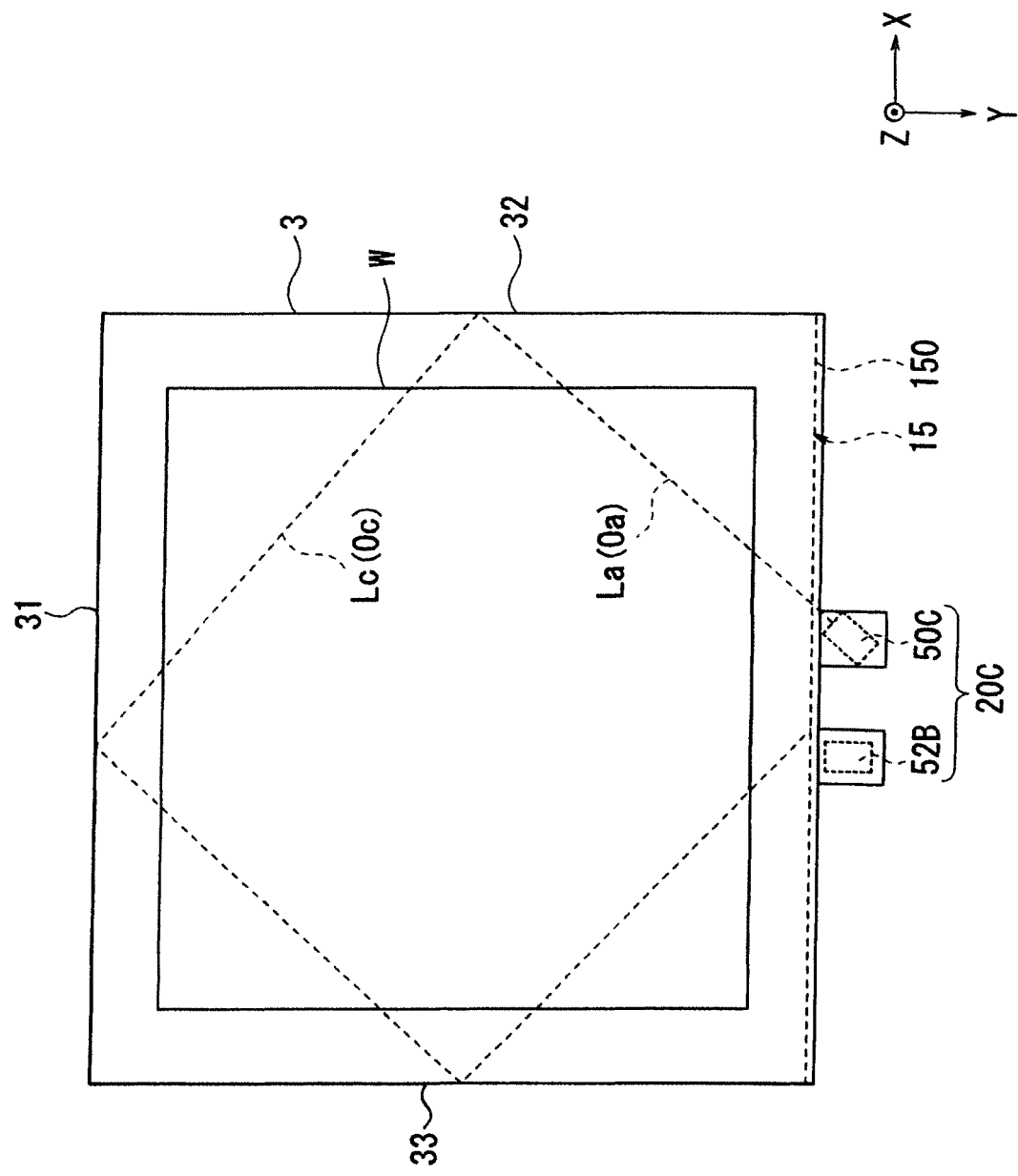
FIG. 6D is a schematic view for explaining an optical path of a light emitted from a light emitting portion constituting the mapping sensor shown in FIG. 5D.
Figure 6E:
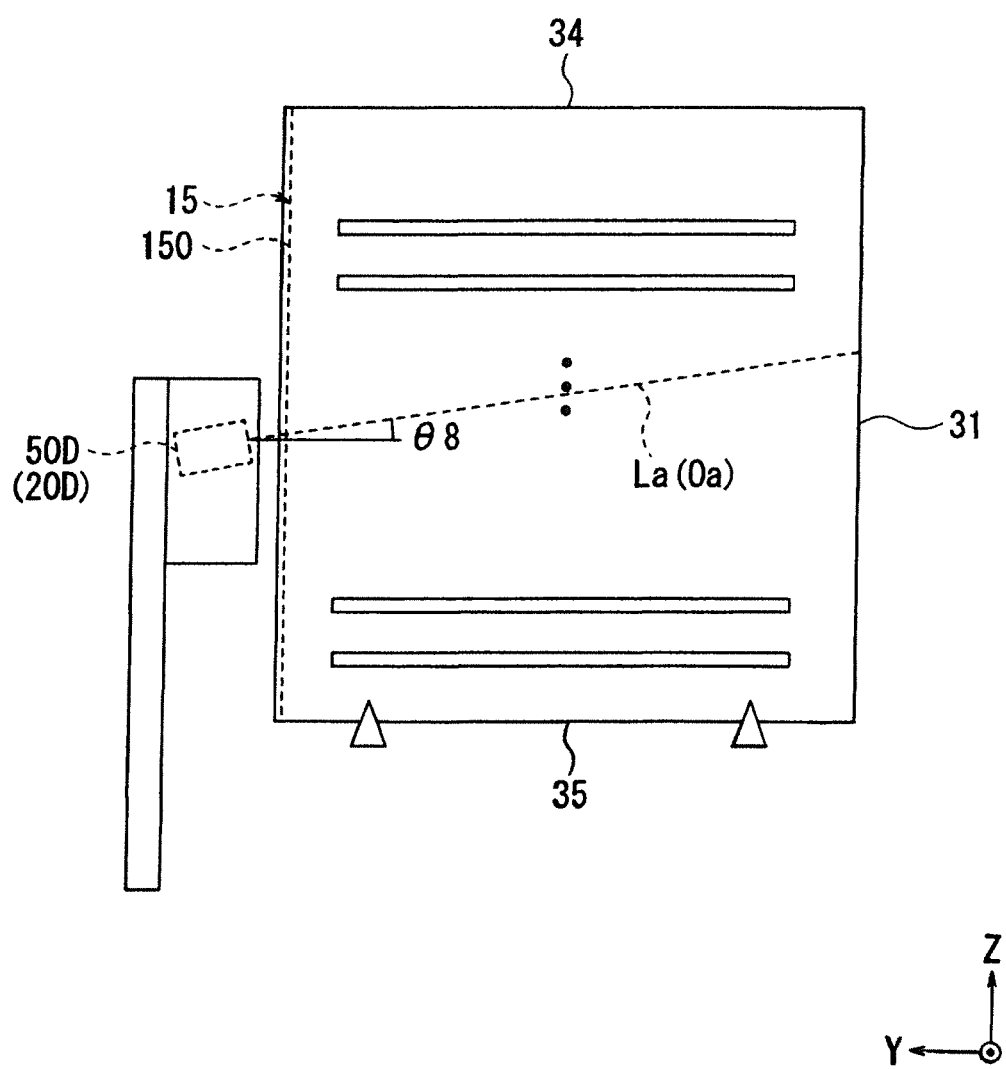
FIG. 6E is a schematic view for explaining an optical path of a light emitted from a light emitting portion constituting a mapping sensor owned by a load port according to Fifth Embodiment of the present invention.
Figure 6F:
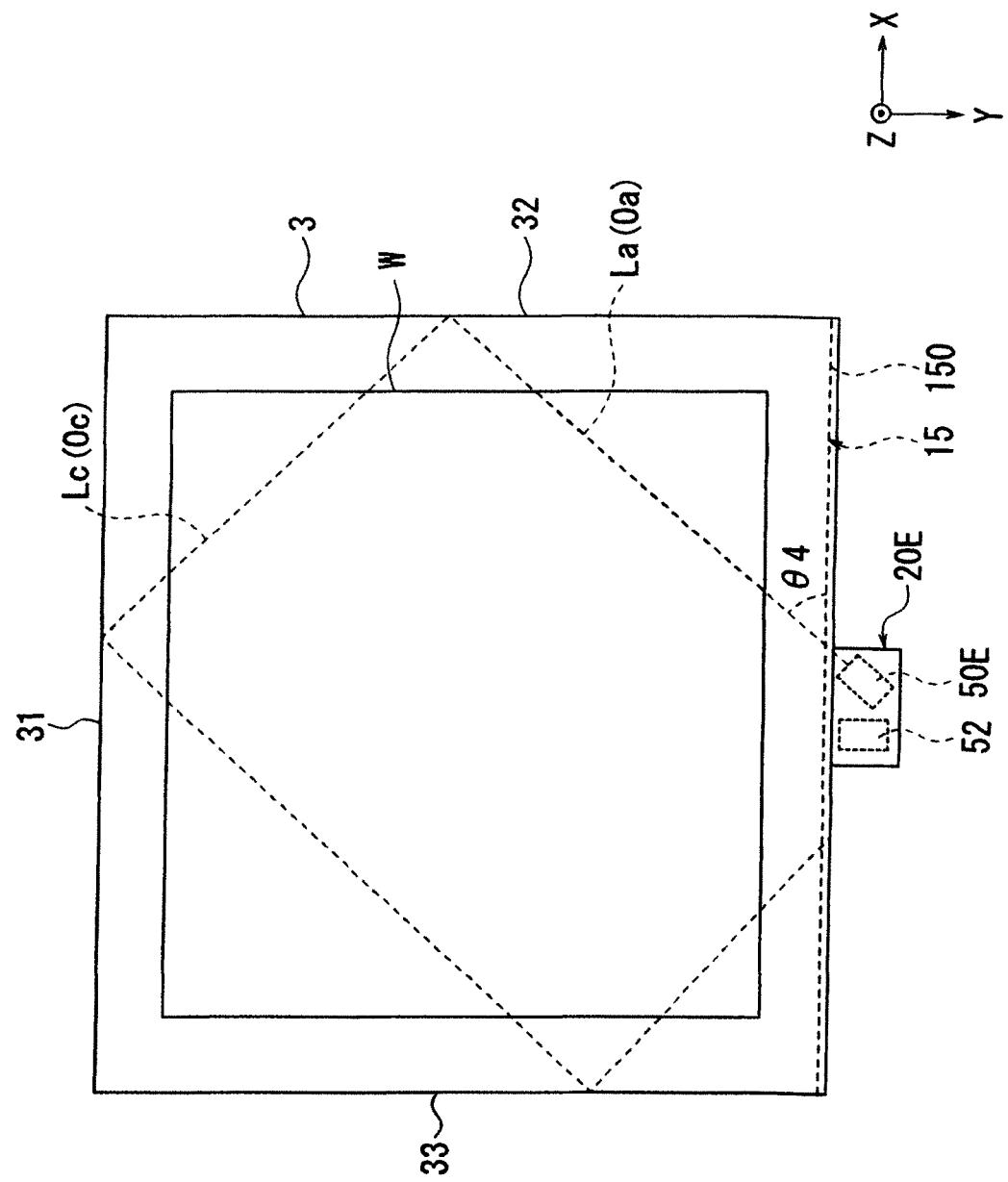
FIG. 6F is a schematic view for explaining an optical path of a light emitted from a light emitting portion constituting a variation of the mapping sensor shown in FIG. 5A.

Like a mapping sensor 20E shown in FIG. 6F, an optical axis Oa of a light La emitted from a light emitting portion 50E may extend to the second inner wall surface 32 located on the lateral of the container body 3 (may cross the second inner wall surface 32). $\Theta 4 > 0$ degree (preferably, $\Theta 4 > 5$ degrees) is satisfied, where $\Theta 4$ is an angle between the optical axis Oa of the light La and the opening surface 150 of the opening 15 (an inclined angle of the optical axis Oa in the crosswise direction).

In that case, the light emitting portion 50E has an adjusted angle so as to face the second inner wall surface 32. Thus, after going to the second inner wall surface 32, the light La emitted from the light emitting portion 50E is reflected on the second inner wall surface 32 and goes from the second inner wall surface 32 to the first inner wall surface 31 as the inner-wall-surface reflected light Lc. The inner-wall-surface reflected light Lc going to the first inner wall surface 31 is reflected on the first inner wall surface 31 and goes from the first inner wall surface 31 to the third inner wall surface 33. Moreover, the inner-wall-surface reflected light Lc going to the third inner wall surface 33 is reflected on the third inner wall surface 33 and goes from the third inner wall surface 33 to the opening 15.

In the illustrated example, the inner-wall-surface reflected light Lc going to the opening 15 does not directly go to the imaging portion 52. Even if this inner-wall-surface reflected light Lc goes to the imaging portion 52, the light La is scattered and absorbed every time it is reflected via the above-mentioned multiple reflections (or via a long light path), and the central part around the optical axis Oc of the inner-wall-surface reflected light Lc is thereby assumed to have a sufficiently weakened light intensity by the time this inner-wall-surface reflected light Lc reaches the imaging portion 52. Thus, the load port 1E according to the present embodiment can prevent the inner-wall-surface reflected light Lc having a strong light intensity from entering the imaging portion 52 and obtain the above-mentioned clear image. Incidentally, this effect can also be demonstrated in the example of FIG. 6A.

Second Embodiment

Next, a load port according to Second Embodiment of the present invention is described based on the figures.

Incidentally, Second Embodiment uses the same references in terms of the same constituents as First Embodiment and does not describe them.

As shown in FIG. 6B, a load port 1A of the present embodiment has a mapping sensor 20A. In the mapping sensor 20A, an imaging portion 52A has an adjusted angle so as to be inclined laterally relative to the first inner wall surface 31 of the container body 3 located on the other side of the opening 15. Instead, the imaging portion 52A has an adjusted angle so as to be inclined laterally relative to the opening surface 150 of the opening 15.

Figure 5B:
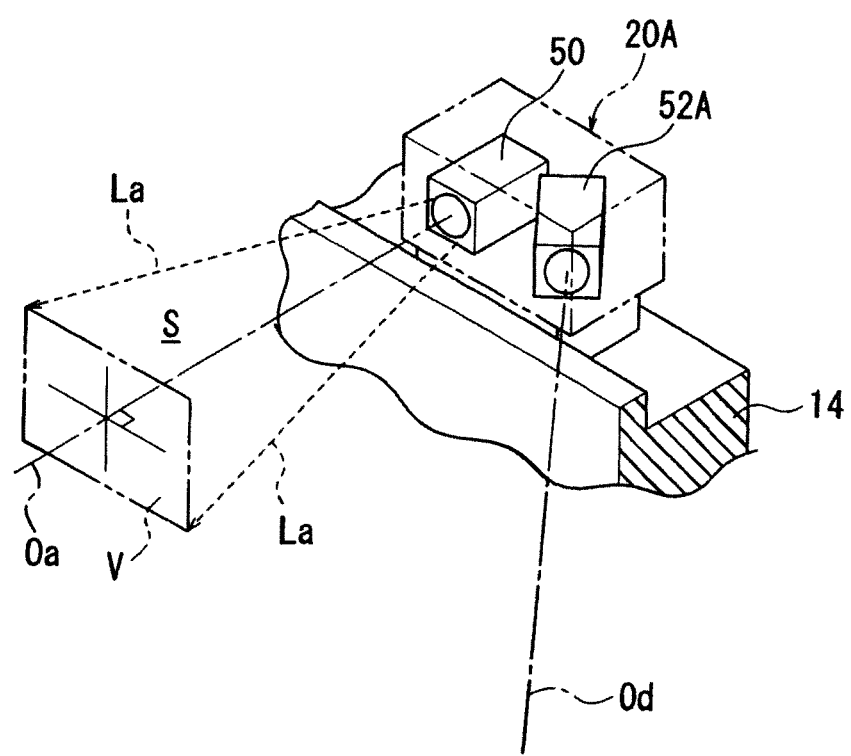
FIG. 5B is an enlarged perspective view around a mapping sensor owned by a load port according to Second Embodiment of the present invention.

Thus, the imaging axis Od of the imaging portion 52A shown in FIG. 5B is inclined toward the lateral of the container body 3 (laterally in the crosswise direction) relative to the first inner wall surface 31 of the container body 3 located on the other side of the opening 15 or the opening surface 150 of the opening 15. Thus, the imaging axis Od of the imaging portion 52A is inclined relative to the first inner wall surface 31 of the container body 3 and is inclined toward the lateral of the semiconductor wafer W relative to the circumference of the rectangular semiconductor wafer W.

In the illustrated example, the imaging portion 52A has an adjusted angle so as to be inclined toward the opposite side of the light emitting portion 50. Thus, the imaging axis Od of imaging portion 52A does not extend to the second inner wall surface 32, but to the third inner wall surface 33. In the present embodiment, the imaging axis Od of the imaging portion 52A crosses a part of the first inner wall surface 31 closer to the third inner wall surface 33 in the crosswise direction.

As shown in FIG. 5B, the imaging portion 52 does not have an adjusted angle as described above, and only the imaging portion 52A has an adjusted angle as described above. Thus, the optical axis Oa of the light La and the imaging axis Od of the imaging portion 52 are not substantially parallel to each other.

Θ5<90 degrees (preferably Θ5<88 degrees, more preferably 80 degrees<Θ5<85 degrees) is satisfied, where Θ5 is an angle between the imaging axis Od of the imaging portion 52A and the opening surface 150 of the opening 15 (an inclined angle of the imaging axis Od in the crosswise direction). When the first inner wall surface 31 of the container body 3, the opening surface 150 of the opening 15, and the circumference of the semiconductor wafer W are substantially parallel to each other, the above-mentioned ranges also apply to Θ6 and Θ7, where Θ6 is an angle between the imaging axis Od of the imaging portion 52A and the first inner wall surface 31 of the container body 3, and Θ7 is an angle between the imaging axis Od of the imaging portion 52A and the circumference of the semiconductor wafer W.

In the present embodiment, however, the angles Θ5 to Θ7 are configured in a range where the imaging axis Od of the imaging portion 52A does not cross the second inner wall surface 32. That is, the lower limits of the angles Θ5 to Θ7 are values of the angles Θ5 to Θ7 when the imaging axis Od goes to the corner of the container body 3 crossed by the first inner wall surface 31 and the third inner wall surface 33.

Incidentally, an angle (an inclined angle of the imaging axis Od in the front-back direction) between the imaging axis Od of the imaging portion 52A and the second inner wall surface 32 or the third inner wall surface 33 (or the optical axis Oa of the light emitting portion 50 shown in FIG. 5B) is (90-Θ5) degrees.

Since the imaging axis Od is inclined relative to the first inner wall surface 31, the imaging axis Od located between the opening 150 and the first inner wall surface 31 has a length that is larger than a length $L_{L1}$ of the container body 3 in the front-back direction (substantially equal to $L_{L1}/\sin Θ5$).

When the imaging portion 52A has an adjusted angle as described above, the central part around the optical axis Oc of the inner-wall-surface reflected light Lc does not go to the imaging portion 52A with a light amount similar to that when the above-mentioned angle adjustment is not carried out. Accordingly, the imaging portion 52A is adjusted so that the central part around the optical axis Oc of the inner-wall-surface reflected light Lc does not go to the imaging portion 52A. Incidentally, if most of the central part around the optical axis Oc do not go to the imaging portion 52A, the central part around the optical axis Oc may partially enter the imaging portion 52A.

In the present embodiment, the same effects as First Embodiment are demonstrated, and it is possible to prevent the central part around the optical axis Oc of the inner-wall-surface reflected light Lc having a strong light intensity from entering the imaging portion 52A and to capture the above-mentioned clear image.

Third Embodiment

Next, a load port according to Third Embodiment of the present invention is described based on the figures.

Incidentally, Third Embodiment uses the same references in terms of the same constituents as First Embodiment and does not describe them.

Figure 5C:
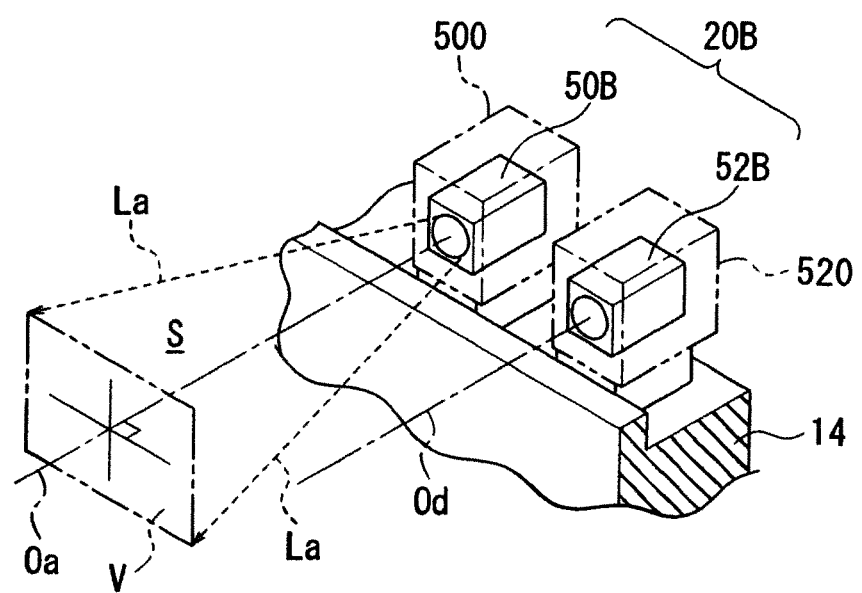
FIG. 5C is an enlarged perspective view around a mapping sensor owned by a load port according to Third Embodiment of the present invention.
Figure 5D:
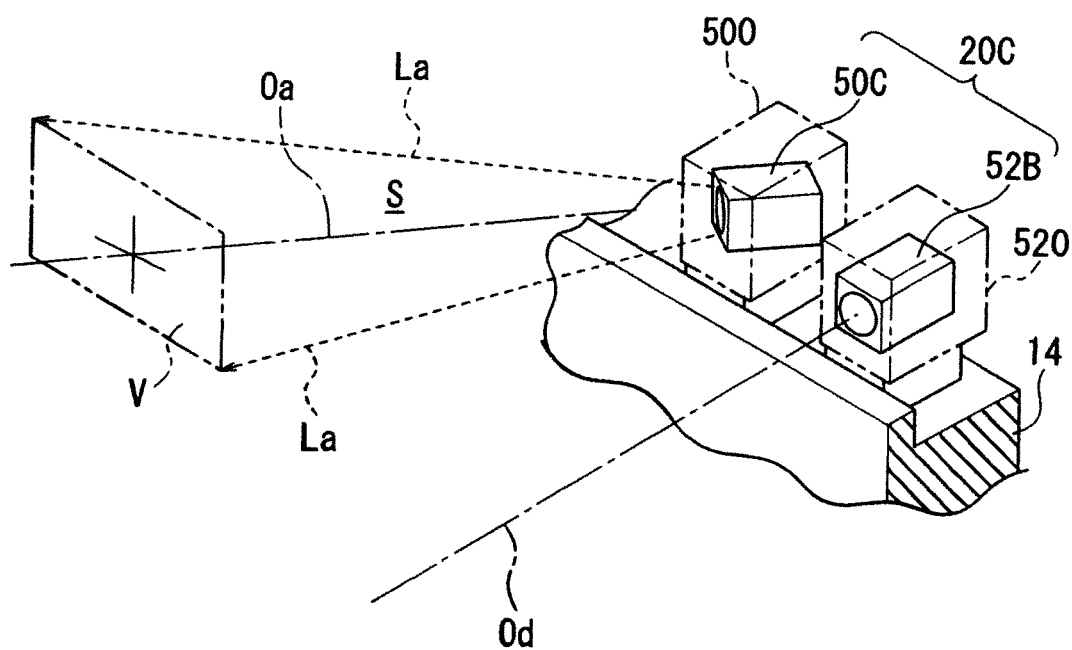
FIG. 5D is an enlarged perspective view around a mapping sensor owned by a load port according to Fourth Embodiment of the present invention.

As shown in FIG. 5C, a load port 1B of the present embodiment has a mapping sensor 20B. In the mapping sensor 20B, a light emitting portion 50B is disposed in a light-emitting-portion installation housing 500, and an imaging portion 52B is disposed in an imaging-portion installation housing 520. The light-emitting-portion installation housing 500 and the imaging-portion installation housing 520 are formed separately and may have various shapes other than the illustrated shape (rectangular parallelepiped). The light emitting portion 50B and the imaging portion 52B are arranged to face the inner wall surface 31.

As shown in FIG. 6C, the light emitting portion 50B (light-emitting-portion installation housing 500) and the imaging portion 52B (imaging-portion installation housing 520) are adjusted to be laterally spaced from each other along the opening surface 150 of the opening 15 with a predetermined distance.

The distance $L_{L2}$ between the light emitting portion 50B and the imaging portion 52B is appropriately adjusted so that the central part around the optical axis Oc goes to a position laterally away from the imaging portion 52B in the return of the inner-wall-surface reflected light Lc to the opening 15. For example, the distance $L_{L2}$ is 10 mm or more.

When the arrangement of the light emitting portion 50B and the imaging portion 52B is adjusted as described above, the central part around the optical axis Oc of the inner-wall-surface reflected light Lc returning to the opening 15 passes between the light emitting portion 50B and the imaging portion 52B. That is, the central part around the optical axis Oc of the inner-wall-surface reflected light Lc does not go to (enter) the imaging portion 52B with a light amount similar to that when the above-mentioned positional adjustment is not carried out (or when the light emitting portion 50B and the imaging portion 52B are attached to the same housing). Accordingly, the light emitting portion 50B and the imaging portion 52B are adjusted so that the central part around the optical axis Oc of the inner-wall-surface reflected light Lc does not go to the imaging portion 52B.

In the illustrated example, the light emitting portion 50B and the imaging portion 52B are sufficiently spaced from each other, and the entire central part around the optical axis Oc is adjusted so as not to go to the imaging portion 52B. If most of the central part around the optical axis Oc do not go to the imaging portion 52B, however, the central part around the optical axis Oc may partially enter the imaging portion 52B.

In the present embodiment, the imaging portion 52B can image the substrate reflected light Lb while avoiding the central part around the optical axis Oc of the inner-wall-surface reflected light Lc having a strong light intensity, and the same effects as First Embodiment are also demonstrated.

In the present embodiment, the positions of the light emitting portion 50B and the imaging portion 52B can separately and independently be adjusted via the light-emitting-portion installation housing 500 and the imaging-portion installation housing 520, and the distance between the light emitting portion 50B and the imaging portion 52B can be adjusted in a wide range. Thus, the positions of the light emitting portion 50B and the imaging portion 52B are flexibly adjusted, and the light emitting portion 50B and the imaging portion 52B can optimally be arranged.

Fourth Embodiment

Next, a load port according to Fourth Embodiment of the present invention is described based on the figures.

Incidentally, Fourth Embodiment uses the same references in terms of the same constituents as Third Embodiment and does not describe them.

As shown in FIG. 6D, a load port 1C of the present embodiment has a mapping sensor 20C. In the mapping sensor 20C, the light emitting portion 50B of the mapping sensor 20B shown in FIG. 6C has an adjusted angle as with the light emitting portion 50E shown in FIG. 6F.

That is, a light emitting portion 50C disposed in the light-emitting-portion installation housing 500 has an adjusted angle so as to be inclined laterally relative to the first inner wall surface 31 and the opening surface 150 of the opening 15, and the optical axis Oa of the light La crosses the first inner wall surface 31.

In the present embodiment, the same effects as First Embodiment and Third Embodiment are demonstrated, and it is possible to prevent the central part around the optical axis Oc of the inner-wall-surface reflected light Lc having a strong light intensity from entering the imaging portion 52B and to capture the above-mentioned clear image. Incidentally, the optical axis Oa of the light La may cross the second inner wall surface 31 by subjecting the light emitting portion 50B to the same angle adjustment as the light emitting portion 50 shown in FIG. 6A.

Fifth Embodiment

Next, a load port according to Fifth Embodiment of the present invention is described based on the figures.

Incidentally, Fifth Embodiment uses the same references in terms of the same constituents as First Embodiment and does not describe them.

As shown in FIG. 6E, a load port 1D of the present embodiment has a mapping sensor 20D. In the mapping sensor 20D, a light emitting portion 50D has an adjusted angle so as to be inclined vertically (upward in the illustrate example, but downward may be acceptable. The same applies hereinafter.) relative to the first inner wall surface 31 of the container body 3 located on the other side of the opening 15. Instead, the light emitting portion 50D has an adjusted angle so as to be inclined upward relative to the opening surface 150 of the opening 15.

Thus, the optical axis Oa of the light La emitted from the light emitting portion 50D is inclined upward in the container body 3 relative to the first inner wall surface 31 of the container body 3 located on the other side of the opening 15 or the opening surface 150 of the opening 15. Thus, the optical axis Oa of the light La emitted from the light emitting portion 50D goes obliquely (obliquely upward) to the first inner wall surface 31.

Although not illustrated in detail, the imaging portion 52 does not have an adjusted angle as described above, and only the light emitting portion 50D has an adjusted angle as described above. Thus, the optical axis Oa of the light La and the imaging axis Od of the imaging portion 52 are not substantially parallel to each other when viewed in a perpendicular plane to the vertical direction (extending in different directions when viewed vertically).

An inclined angle Θ8 of the light emitting portion 50D in the front-back direction is appropriately adjusted so that the central part around the optical axis Oc of the inner-wall-surface reflected light Lc goes to the above of the imaging portion 52 (not shown) while avoiding it in the return of the inner-wall-surface reflected light Lc to the opening 15. For example, the angle Θ8 is 5 degrees or more.

In the illustrated example, the light emitting portion 50D has an adjusted angle so that the optical axis Oa of the light La extends obliquely upward to the first inner wall surface 31 (crosses the first inner wall surface 31), but may have an adjusted angle so that the optical axis Oa of the light La extends obliquely upward to a fourth inner wall surface 34 or a fifth inner wall surface 35. In this case, the optical axis Oa of the light La crosses the fourth inner wall 34 or the fifth inner wall 35.

When the light emitting portion 50D has an adjusted angle as described above, the central part around the optical axis Oc of the inner-wall-surface reflected light Lc does not go to (enter) the imaging portion 52 with a light amount similar to that when the light emitting portion 50D does not have an adjusted angle as described above. Accordingly, the light emitting portion 50D and the imaging portion 52 are adjusted so that the central part around the optical axis Oc of the inner-wall-surface reflected light Lc does not go to the imaging portion 52. Incidentally, the optical axis Oa of the light La emitted from the light emitting portion 50D goes to the opening 15 via reflection on one or more semiconductor wafers W (indirectly) or goes to the opening 15 directly. The inner-wall-surface reflected light Lc reflected on the first inner wall surface 31 goes to the opening 15 indirectly or directly.

Incidentally, the light emitting portion 50D is preferably adjusted so that the entire central part around the optical axis Oc of the inner-wall-surface reflected light Lc does not go to the imaging portion 52. If most of the central part around the optical axis Oc do not go to the imaging portion 52, however, the central part around the optical axis Oc may partially enter the imaging portion 52.

In the present embodiment, the imaging portion 52 can image the substrate reflected light Lb while avoiding the central part around the optical axis Oc of the inner-wall-surface reflected light Lc having a strong light intensity, and the same effects as First Embodiment are also demonstrated.

Sixth Embodiment

Next, a load port according to Sixth Embodiment of the present invention is described based on the figures.

Incidentally, Sixth Embodiment uses the same references in terms of the same constituents as First Embodiment and does not describe them.

Figure 11:
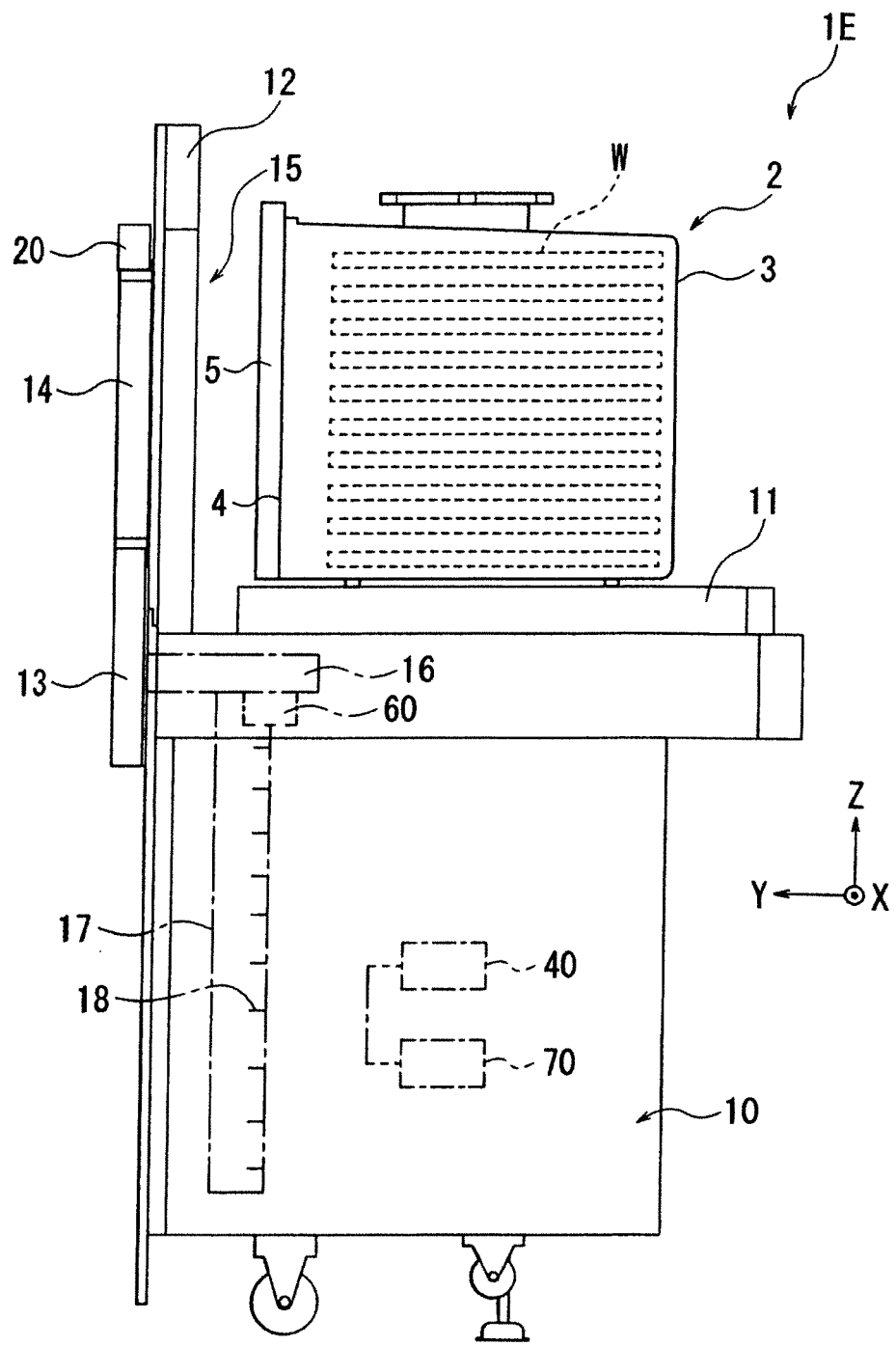
FIG. 11 a longitudinal cross-sectional view illustrating a load port of Sixth Embodiment of the present invention.

As shown in FIG. 11, a load port 1E of the present embodiment has a mapping determiner 70.

The mapping determiner 70 receives the image 51 captured by the mapping sensor 20 from the controller 40. The captured image 51 corresponds to a position detection signal detected by the position detection sensor 60. The mapping determiner 70 determines a housed state of each of the semiconductor wafer W contained in the housing shelf 8 of the container 2 (whether or not the semiconductor wafers W are overlapped, whether or not the semiconductor wafers W are arranged obliquely, whether or not the semiconductor wafers W are present, and the like) and records the determination result at the data record section while corresponding the determination result to the position detection signal.

In the present embodiment, the mapping determiner 70 can determine the housed state based on various conditions configured in advance, and it is thereby possible to more precisely and quickly determine the housed state of the semiconductor wafers W. Thus, a mapping operation can efficiently be carried out.

In the load port 1E of the present embodiment, the data record section may record a standard image of the semiconductor wafer W captured by the mapping sensor 20 and determined to be normally housed in the container body 3. Based on the premise, the mapping determiner 70 may determine whether the housed state of the semiconductor wafer W is good or not by comparing the image 51 actually captured by the mapping sensor 20 with the standard image recorded at the data record section.

In this structure, the mapping determiner 70 can more precisely and quickly determine whether the housed state of the semiconductor wafer W is good or not by comparing the image 51 actually captured by the mapping sensor 20 with the standard image captured in advance.

Incidentally, the present invention is not limited to the above-mentioned embodiments, and needless to say, includes any other embodiments and variations. In each of the above-mentioned embodiments, for example, the light emitting portion 50, the imaging portion 52, and the like may have an inclined angle, a distance between the light emitting portion 50 and the imaging portion 52, and the like that are controllable by the controller 40 or other control means. In this case, if necessary, it is possible to adjust the inclined angle, the arrangement, and the like of the light emitting portion 50, the imaging portion 52, and the like.

In First Embodiment, the angles $\Theta 1$ to $\Theta 3$ do not need to be the same. For example, the angle $\Theta 1$ and the angle $\Theta 2$ may be different from each other.

In First Embodiment, the imaging portion 52 shown in FIG. 6A may have an adjusted angle as with the imaging portion 52A shown in FIG. 6B.

In Second Embodiment, the imaging axis Od of the imaging portion 52A shown in FIG. 6B may extend to the third inner wall surface 33 (may cross the third inner wall surface 33).

In Fourth Embodiment, the optical axis Oa of the light La extends to the second inner wall surface 32 as shown in FIG. 6D, but may extend to the first inner wall surface 31.

In Fourth Embodiment, the imaging portion 52B may have an adjusted angle as with the imaging portion 52A shown in FIG. 6B. At this time, the optical axis Oa of the light La may extend to the third inner wall surface 33 (may cross the third inner wall surface 33).

In Fifth Embodiment, the light emitting portion 50D shown in FIG. 6E and the imaging portion 52 may have an adjusted angle as with FIG. 6A to FIG. 6D and FIG. 6F.

In Fifth Embodiment, the imaging portion 52 may have an adjusted angle as with the light emitting portion 50D. That is, the imaging portion 52 may have an adjusted angle so as to be inclined vertically (upward or downward) relative to the first inner wall surface 31 of the container body 3 located on the other side of the opening 15. Instead, the imaging portion 52 may have an adjusted angle so as to be inclined upward or downward relative to the opening surface 150 of the opening 15.

In First Embodiment, the light emitting portion 50 may have an adjusted angle so as to be inclined toward the imaging portion 52. In Second Embodiment, the imaging portion 52A may have an adjusted angle so as to be inclined toward the light emitting portion 50. In Fourth Embodiment, the light emitting portion 50C may have an adjusted angle so as to be inclined toward the imaging portion 52B.

Figure 7:
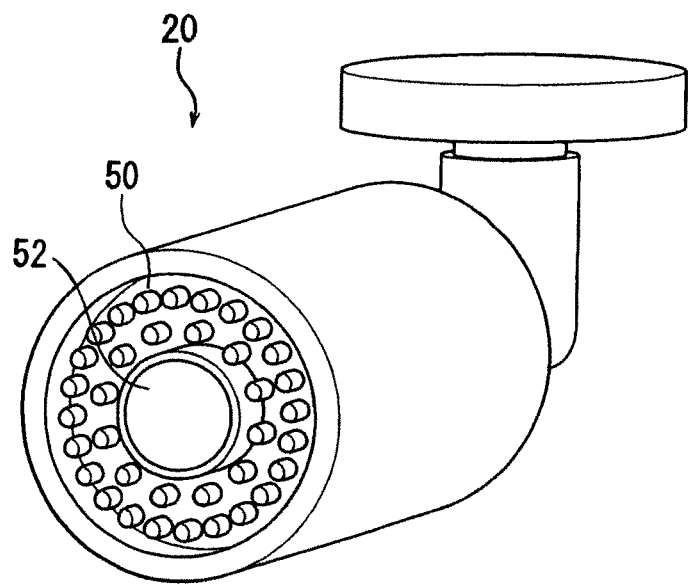
FIG. 7 is a perspective view illustrating a variation of the mapping sensor shown in FIG. 5A to FIG. 5D.

In the above-mentioned embodiments, for example, the present invention may apply to the mapping sensor 20 shown in FIG. 7. That is, as shown in FIG. 7, the mapping sensor 20 may be provided with a ring-shaped light emitting portion 50 having a plurality of LEDs arranged to surround the imaging portion 52.

In the above-mentioned embodiments, the mapping sensors 20 to 20E may be movable forward in the front-back direction relative to the opening surface 150 of the opening 15.

The above-mentioned embodiments may include a mechanism for controlling the light amount of the light La emitted from the light emitting portion 50 or so. For example, a filter, a slit, or the like for reducing the light amount of the light La may be disposed in front of the end surface of the light emitting portion 50 or so.

The load ports of the above-mentioned embodiments may be provided with both of the transmission-type light sensor shown in Patent Document 1 and the mapping sensors 20 to 20E of the present invention.

In the above-mentioned embodiments, the semiconductor wafers W are explained as substrates, but this is not the only one case. For example, the substrate may be a glass wafer for semiconductor package.

In the above-mentioned embodiments, the mapping sensors 20 to 20E are attached to the upper edge of the door 14, but may be attached to any other part of the door 14. The mapping sensors 20 to 20E should integrally be fixed to the door 14, but their attachment position is not limited to the upper edge of the door 14. At this time, the mapping sensors 20 to 20E should be located at the same height as or higher than the semiconductor wafer W placed on the uppermost stage among a plurality of semiconductor wafers W contained in the container 2.

In the above-mentioned embodiments, the mapping sensors 20 to 20E are attached to the door 14, but the number of mapping sensors 20 to 20E is not limited to one and may be plural. In this case, for example, the multiple mapping sensors 20 to 20E may be configured to capture the same visual field of the semiconductor wafer W or may be configured to image different visual fields of the semiconductor wafer W.

In Sixth Embodiment, for example, when the same visual field is captured using two mapping sensors 20, a common image region can be imaged by two imaging portions 52, and a clearer image 51 without noise can thereby be captured by carrying out an image processing, such as a comparison processing between the image 51 captured by one of the mapping sensors 20 and the image 51 captured by the other mapping sensor 20. Based on the images 51, the mapping determiner 70 can thereby more accurately determine the housed state of the semiconductor wafer W.

In Sixth Embodiment, when different visual fields are captured using two mapping sensors 20, for example, a common semiconductor wafer W can be subjected to a determination of a housed state based on the image 51 captured by one of the mapping sensors 20 and to a determination of a housed state based on the image 51 captured by the other mapping sensor 20.

Thus, for example, the housed state of the semiconductor wafer W can be considered to be "good" when both of the determinations of the housed state based on the two images 51 are considered to be "good", and the housed state of the semiconductor wafer W can be considered to be "bad" when either of the determinations of the housed state based on the two images 51 is considered to be "bad". It is thereby possible to more accurately determine the housed state of the semiconductor wafer W.

In the above-mentioned embodiments, the light emitting portions 50 of the mapping sensors 20 to 20E may constantly emit the imaging light La in accordance with the downward movement of the door 14 (a so-called static lighting system) or may intermittently emit the imaging light La in correspondence with the position of the semiconductor wafer W (a so-called pulse lighting system). In the pulse lighting system, the imaging portion 52 captures the image 51 in correspondence with the pulse emission.

In the above-mentioned embodiments, a relative position of the mapping sensors 20 to 20E with respect to the semiconductor wafer W is configured to be detected using the sensor dog 18, but may be detected without the sensor dog 18. For example, an upward and downward movement of the door 14 is detected using an encoder, and a relative position of the mapping sensors 20 to 20E with respect to the semiconductor wafer W may be detected based on an output signal from the encoder.

DESCRIPTION OF THE REFERENCE NUMERICAL

S . . . lighted area
W . . . semiconductor wafer (substrate)
1, 1A, 1B, 1C, 1D, 1E . . . load port
2 . . . container
3 . . . container body
4 . . . container opening
5 . . . lid
10 . . . control box
11 . . . movable table
12 . . . frame
13 . . . support frame
14 . . . door
15 . . . opening
150 . . . opening surface
16 . . . drive portion
17 . . . rod
18 . . . sensor dog
20, 20A, 20B, 20C, 20D, 20E . . . mapping sensor
40 . . . controller
50, 50B, 50C, 50D, 50E . . . light emitting portion
500 . . . light-emitting-portion installation housing
51 . . . image
52, 52A, 52B . . . imaging portion
520 . . . imaging-portion installation housing
60 . . . position detection sensor
70 . . . mapping determiner

What is claimed is:

1. A load port comprising:
 a door configured to move upward and downward between a closing position for closing an opening connected into a container with multiple stages for placing a plurality of substrates and an opening position for opening the opening; and
 a mapping sensor disposed integrally with the door and configured to detect a state of the substrates, the mapping sensor including:
  a light emitting portion configured to emit an imaging light toward the substrates; and
  an imaging portion configured to capture an image of a reflected light of the imaging light,
 wherein an imaging axis of the imaging portion and an optical axis of the imaging light separate from each other as they approach the opening.

2. The load port according to claim 1, wherein at least one of the light emitting portion and the imaging portion is adjusted so that an optical axis central part of an inner-wall-surface reflected light reflected on an inner wall surface of the container does not directly go to the imaging portion.

3. The load port according to claim 2, wherein at least one of the optical axis of the imaging light and the imaging axis of the imaging portion is inclined relative to the inner wall surface located opposite the opening or to an opening surface of the opening.

4. The load port according to claim 3, wherein at least one of the optical axis of the imaging light and the imaging axis of the imaging portion is laterally inclined relative to the container.

5. The load port according to claim 4, wherein the optical axis of the imaging light extends to the inner wall surface on a side of the container.

6. The load port according to claim 5, wherein only the optical axis of the imaging light is inclined relative to the inner wall surface located opposite the opening or to the opening surface of the opening.

7. The load port according to claim 5, wherein at least one of the optical axis of the imaging light and the imaging axis of the imaging portion is inclined toward a height direction of the container.

8. The load port according to claim 5, wherein the light emitting portion and the imaging portion are laterally spaced from each other along the opening at a predetermined distance.

9. The load port according to claim 4, wherein only the optical axis of the imaging light is inclined relative to the inner wall surface located opposite the opening or to the opening surface of the opening.

10. The load port according to claim 4, wherein at least one of the optical axis of the imaging light and the imaging axis of the imaging portion is inclined toward a height direction of the container.

11. The load port according to claim 4, wherein the light emitting portion and the imaging portion are laterally spaced from each other along the opening at a predetermined distance.

12. The load port according to claim 3, wherein only the optical axis of the imaging light is inclined relative to the inner wall surface located opposite the opening or to the opening surface of the opening.

13. The load port according to claim 12, wherein at least one of the optical axis of the imaging light and the imaging axis of the imaging portion is inclined toward a height direction of the container.

14. The load port according to claim 12, wherein the light emitting portion and the imaging portion are laterally spaced from each other along the opening at a predetermined distance.

15. The load port according to claim 3, wherein at least one of the optical axis of the imaging light and the imaging axis of the imaging portion is inclined toward a height direction of the container.

16. The load port according to claim 15, wherein the light emitting portion and the imaging portion are laterally spaced from each other along the opening at a predetermined distance.

17. The load port according to claim 3, wherein the light emitting portion and the imaging portion are laterally spaced from each other along the opening at a predetermined distance.

18. The load port according to claim 2, wherein the light emitting portion and the imaging portion are laterally spaced from each other along the opening at a predetermined distance.

19. The load port according to claim 18, wherein
the light emitting portion is disposed in a light-emitting-portion installation housing,
the imaging portion is disposed in an imaging-portion installation housing, and
the light-emitting-portion installation housing and the imaging-portion installation housing are formed separately.

20. A load port comprising:
a door configured to move upward and downward between a closing position for closing an opening connected into a container with multiple stages for placing a plurality of substrates and an opening position for opening the opening; and
a mapping sensor disposed integrally with the door and configured to detect a state of the substrates, the mapping sensor including:
a light emitting portion configured to emit an imaging light toward the substrates; and
an imaging portion configured to capture an image of a substrate reflected light reflected on the substrate and an inner-wall-surface reflected light reflected on an inner wall surface of the container,
wherein an imaging axis of the imaging portion is inclined relative to the inner wall surface located on an opposite side of the opening or to an opening surface of the opening.

* * * * *